United States Patent
Choi et al.

(10) Patent No.: US 10,284,360 B2
(45) Date of Patent: May 7, 2019

(54) ELECTRONIC CIRCUIT ADJUSTING DELAY DEPENDING ON COMMUNICATION CONDITION

(71) Applicant: SAMSUNG ELECTRONICS CO., LTD., Suwon-si, Gyeonggi-do (KR)

(72) Inventors: Dongho Choi, Seoul (KR); Younwoong Chung, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 65 days.

(21) Appl. No.: 15/415,336

(22) Filed: Jan. 25, 2017

(65) Prior Publication Data

US 2018/0152282 A1  May 31, 2018

(30) Foreign Application Priority Data

Nov. 29, 2016  (KR) .................. 10-2016-0160795

(51) Int. Cl.
| | | |
|---|---|---|
| *H03K 5/133* | (2014.01) | |
| *H04L 7/00* | (2006.01) | |
| *H03L 7/08* | (2006.01) | |
| *H03L 7/099* | (2006.01) | |
| *H03K 5/00* | (2006.01) | |

(52) U.S. Cl.
CPC .......... *H04L 7/0037* (2013.01); *H03K 5/133* (2013.01); *H03L 7/0807* (2013.01); *H03L 7/0992* (2013.01); *H03K 2005/00019* (2013.01)

(58) Field of Classification Search
CPC ..... H04L 7/0037; H03L 7/0807; H03K 5/133; H03K 2005/00019
See application file for complete search history.

(56) References Cited

U.S. PATENT DOCUMENTS

| | | | |
|---|---|---|---|
| 6,463,092 B1 * | 10/2002 | Kim | .............. G09G 5/006 370/284 |
| 7,801,262 B2 | 9/2010 | Wallberg et al. | |
| 8,085,066 B2 | 12/2011 | Brodt et al. | |
| 8,248,106 B1 | 8/2012 | Cohen et al. | |
| 9,036,755 B2 | 5/2015 | Xiu | |
| 9,363,071 B2 | 6/2016 | Sengoku et al. | |
| 2006/0132335 A1 * | 6/2006 | Kojima | ............... H03M 7/06 341/58 |
| 2009/0086868 A1 | 4/2009 | Shiraishi et al. | |

(Continued)

*Primary Examiner* — Chieh M Fan
*Assistant Examiner* — Sung Ahn
(74) *Attorney, Agent, or Firm* — Volentine, Whitt & Francos, PLLC

(57) ABSTRACT

An electronic circuit receives transmission signals from three or more communication lines. The electronic circuit includes a clock-data recovery circuit and a control value generation circuit. The clock-data recovery circuit outputs a recovered clock based on a transition generated in reception signals. The clock-data recovery circuit outputs recovered signals based on the recovered clock and the reception signals. The recovered clock has a first edge in response to the transition generated in the reception signals. The recovered clock has a second edge in response to a reset signal generated based on a delay of the recovered clock. The delay of the recovered clock is adjusted based on a control value provided from the control value generation circuit. The control value is adjusted based on change of a communication condition.

20 Claims, 22 Drawing Sheets

(56) References Cited

U.S. PATENT DOCUMENTS

2013/0241759 A1 9/2013 Wiley et al.
2014/0286466 A1 9/2014 Sengoku et al.
2015/0201052 A1 7/2015 Li et al.

* cited by examiner

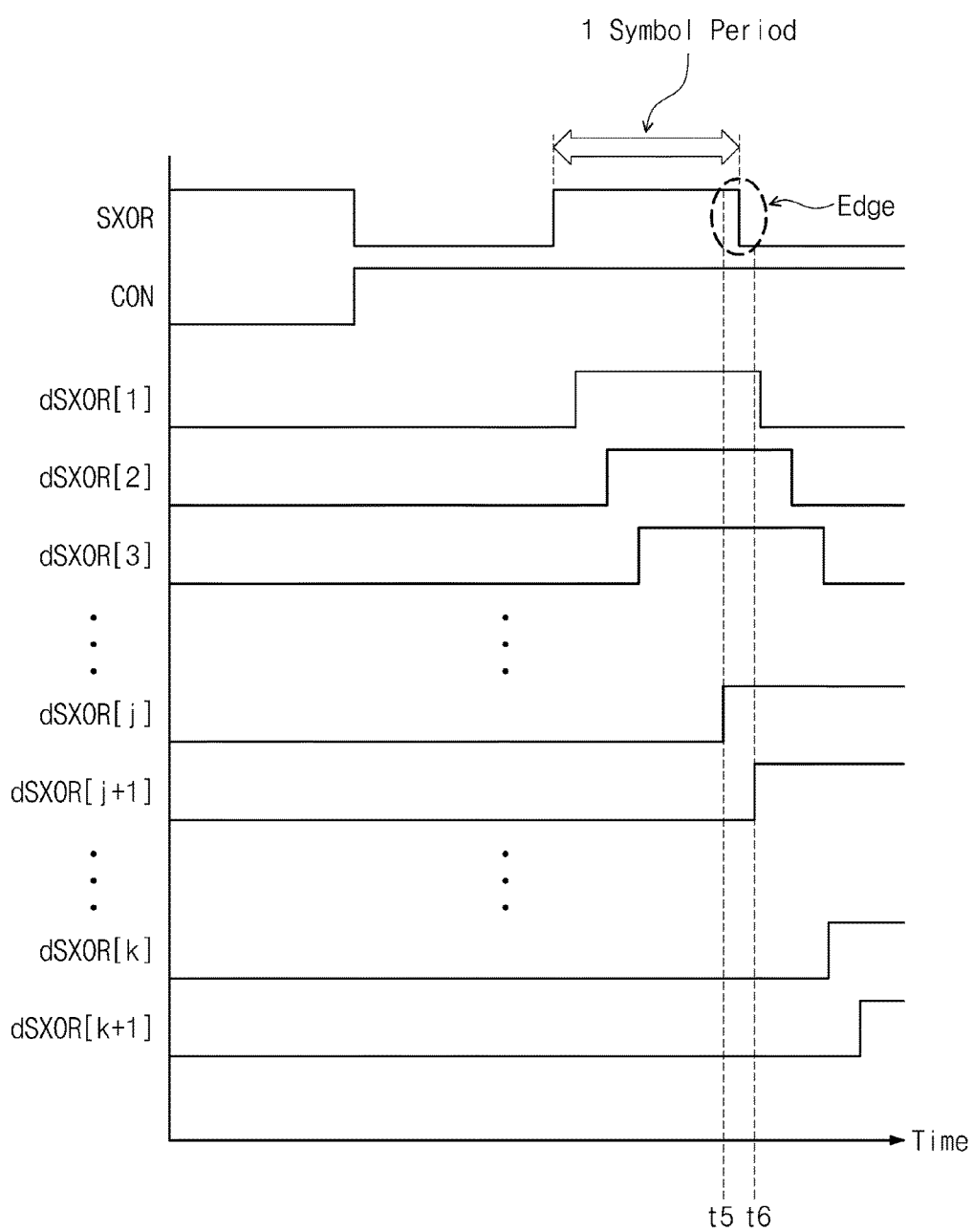

ELECTRONIC CIRCUIT ADJUSTING DELAY DEPENDING ON COMMUNICATION CONDITION

CROSS-REFERENCE TO RELATED APPLICATIONS

The present application claims priority under 35 U.S.C. § 119 to Korean Patent Application No. 10-2016-0160795 filed on Nov. 29, 2016, in the Korean Intellectual Property Office, the entire contents of which are incorporated herein by reference.

TECHNICAL FIELD

Example embodiments of the present disclosure relate to interfacing between electronic circuits/devices, and more particularly, relate to a configuration and an operation of an electronic circuit/device that receives a signal from another electronic circuit/device.

DESCRIPTION OF THE RELATED ART

Nowadays, various kinds of electronic devices are being used. The electronic device performs its own function(s) based on operations of various electronic circuits included therein. The electronic circuit/device operates independently or operates while communicating with any other electronic circuit/device(s). The electronic circuit/device may employ an interface protocol to communicate with any other electronic circuit/device(s).

For example, a transmission circuit/device may transmit a signal to a reception circuit/device in compliance with an interface protocol. The reception circuit/device may obtain data corresponding to a received signal by processing the received signal. Accordingly, the transmission circuit/device and the reception circuit/device may communicate with each other in compliance with an interface protocol to exchange data with each other.

Some electronic circuits may receive a clock from an independent clock generation circuit to operate in response to the clock. Alternatively, some electronic circuits may extract a clock from transition of a specific signal, and may operate based on the extracted clock. To this end, some electronic circuits may include a clock-data recovery circuit. For example, some reception circuits/devices may extract or recover a clock from a signal that is received from a transmission circuit/device. Such reception circuits/devices may appropriately recover data corresponding to a received signal, in response to the extracted or recovered clock.

Also, communication between electronic circuits/devices may be performed through two lines for transmitting a differential signal. Compared with a single signal of a single line, the differential signal may be useful to avoid an error due to noises. However, since two lines are used to transmit one data symbol, efficiency of communication may be degraded compared with implementation of a single line. For this reason, recently, an interface manner for communicating through three lines has been proposed. When the number of lines increases, the number of bits may increase and more data symbols may be communicated during a specific time period, thus efficiency of communication may be improved.

SUMMARY

The example embodiments of the present disclosure may provide an electronic circuit/device that is configured to receive a signal from another electronic circuit/device through three or more communication lines. In the example embodiments, the electronic circuit/device may recover a clock based on a received signal, to appropriately control timing of various operations. In addition, the electronic circuit/device may adjust a delay of an internal delay circuit depending on a communication condition, to appropriately provide edges of the recovered clock.

In some example embodiments, an electronic circuit may receive transmission signals from three or more communication lines. The electronic circuit may include a plurality of buffers, a clock-data recovery circuit, and a control value generation circuit. The plurality of buffers may output reception signals, based on transmission signal pairs which are differently selected from the transmission signals. The clock-data recovery circuit may include a first plurality of delay cells, a clock recovery section, and a data recovery section. The clock recovery section may output a recovered clock, based on a transition generated in the reception signals. The data recovery section may output recovered signals, based on the recovered clock and the reception signals. The control value generation circuit may include a second plurality of delay cells. The control value generation circuit may output a control value, based on outputs from the second plurality of delay cells. The recovered clock may have a first edge, in response to the transition generated in the reception signals. The recovered clock may have a second edge, in response to a reset signal that is generated based on a delay of the recovered clock through the first plurality of delay cells. The delay of the recovered clock through the first plurality of delay cells may be adjusted based on the control value.

In some example embodiments, an electronic circuit may include a clock recovery section and a data recovery section. The clock recovery section may output a recovered clock, based on a transition generated in three or more reception signals. The data recovery section may output recovered signals, based on the reception signals, in response to the recovered clock. The recovered clock may have a first edge, in response to the transition generated in the reception signals. The recovered clock may have a second edge, in response to a reset signal that is generated based on a delay of the recovered clock. The delay of the recovered clock may be adjusted depending on a data rate of the reception signals.

In some example embodiments, an electric circuit may include a clock-data recovery circuit and a control value generation circuit. The clock-data recovery circuit may generate a first combination signal, based on a transition generated in three or more reception signals. The clock-data recovery circuit may output a recovered clock based on the first combination signal and a reset signal, which is generated by delaying the first combination signal. The clock-data recovery circuit may output recovered signals which are generated from the reception signals, in response to the recovered clock. The control value generation circuit may output a control value, based on at least one of a delay of a second combination signal, which is generated based on the reception signals, or a frequency of an oscillation clock. A delay of the first combination signal may be adjusted based on the control value.

According to the example embodiments, the electronic circuit may recover a clock which is suitable to recover data. In particular, even if a communication condition is changed (e.g., change in a data rate of a signal, process-voltage-temperature variation, and/or the like), the electronic circuit may suitably provide edges of the recovered clock, based on a delay which is optimized for the changed communication condition. Accordingly, the recovered clock may provide an optimal setup/hold period even in any communication condition.

In some example embodiments, an electric circuit includes a clock recovery circuit and a data recovery circuit. The clock recovery circuit generates a first transition of a first clock signal in response to detecting a first signal transition within any one of three receptions signals and generates a second transition, opposite to the first transition, of the first clock signal in response to detecting the first signal transition within the one reception signal after the one reception signal is delayed by a predetermined period of time. The data recovery circuit samples a data value of the one reception signal simultaneously with the second transition of the first clock signal. Each of the three reception signals is received through a separate communication channel.

BRIEF DESCRIPTION OF THE DRAWINGS

The above and other objects and features will become apparent from the following descriptions with reference to the following figures, wherein like reference numerals may refer to like parts throughout the following figures unless otherwise specified, and wherein:

FIG. 7 is a timing diagram for describing an example operation of a control value generation circuit of FIG. 6A;

DETAILED DESCRIPTIONS OF EXAMPLE EMBODIMENTS

Below, some example embodiments will be described in detail and clearly with reference to accompanied drawings such that those skilled in the art can easily implement the present disclosure.

Figure 1:
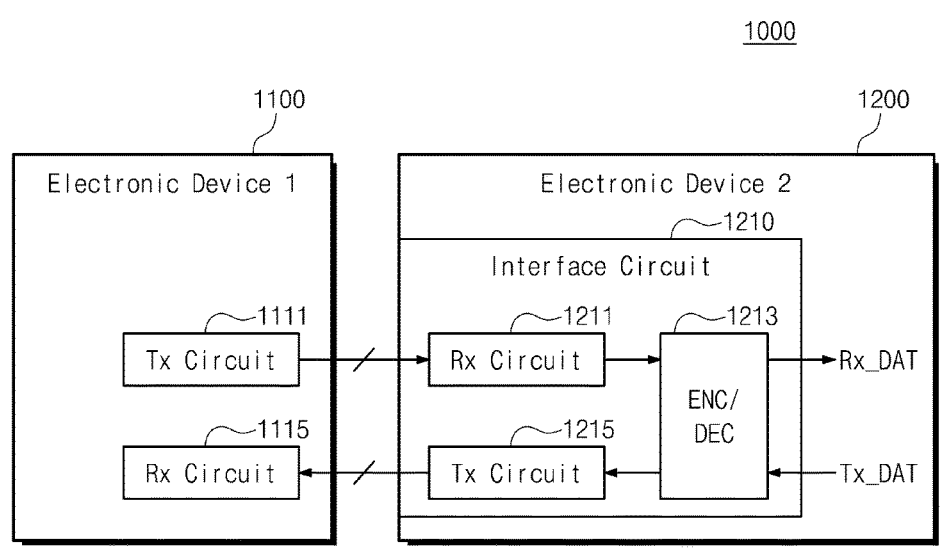
FIG. 1 is a block diagram illustrating an electronic system that includes electronic circuits/devices according to some example embodiments.

FIG. 1 is a block diagram illustrating an electronic system that includes electronic circuits/devices according to some example embodiments. An electronic system 1000 may include electronic devices 1100 and 1200 that may communicate with each other.

The first electronic device 1100 may include a transmission circuit 1111 and a reception circuit 1115. The second electronic device 1200 may include a reception circuit 1211 and a transmission circuit 1215. The reception circuit 1211 may receive a signal from the transmission circuit 1111, and the transmission circuit 1215 may transmit a signal to the reception circuit 1115. Accordingly, the second electronic device 1200 may communicate with the first electronic device 1100. FIG. 1 illustrates bidirectional communication between the electronic devices 1100 and 1200, but in some example embodiments, only unidirectional communication may be possible.

For example, the second electronic device 1200 may include an interface circuit 1210. The interface circuit 1210 may be configured to process an interface protocol employed by the second electronic device 1200, to communicate with the first electronic device 1100. The interface circuit 1210 may be configured to deal with at least one of various interface protocols.

The interface circuit 1210 may include a number of layers. For example, the interface circuit 1210 may include a physical layer that includes physical electronic circuits configured to transmit/receive signals. For example, the interface circuit 1210 may include a link layer that is configured for processing of data symbols, management of packet composition/decomposition, control of a communication path and timing, detection of errors, and/or the like. For example, the interface circuit 1210 may include an application layer that is configured to provide services while transmitting/receiving information through the link layer.

The reception circuit 1211 and the transmission circuit 1215 may be implemented as electronic circuits, and may be included in the physical layer of the interface circuit 1210. The reception circuit 1211 and the transmission circuit 1215 may physically receive/transmit a signal for the second electronic device 1200. The reception circuit 1211 and the transmission circuit 1215 may receive/transmit a signal in compliance with the interface protocol employed by the interface circuit 1210, and may process the received/to-be-transmitted signal.

A signal output from the reception circuit 1211 may be provided to an encoder/decoder circuit 1213. The encoder/decoder circuit 1213 may decode the provided signal to output reception data Rx_DAT. The reception data Rx_DAT may be provided to other component(s) (e.g., a processor/controller, a display driver, and/or the like) of the second electronic device 1200. Accordingly, the second electronic device 1200 may provide service(s) by performing its own function(s), based on the reception data Rx_DAT.

The second electronic device 1200 may generate transmission data Tx_DAT. The transmission data Tx_DAT may be provided from other component(s) (e.g., a processor/controller, a memory device, and/or the like) of the second electronic device 1200 to the encoder/decoder circuit 1213. The encoder/decoder circuit 1213 may encode the transmission data Tx_DAT, and may provide the encoded data to the transmission circuit 1215. The transmission circuit 1215 may transmit a signal to the reception circuit 1115 based on the encoded signal.

The first electronic device 1100, the transmission circuit 1111, and the reception circuit 1115 may be configured to be the same as or similar to the second electronic device 1200, the transmission circuit 1215, and the reception circuit 1211, respectively. For example, the first electronic device 1100 may include an interface circuit. For example, the first electronic device 1100 may process transmission/reception data to communicate with the second electronic device 1200. For brevity, detailed descriptions of the first electronic device 1100 will be omitted below.

In some example embodiments, the electronic system 1000 may be implemented in a single electronic device. For example, the electronic system 1000 may include one of various electronic devices, such as a desktop computer, a laptop computer, a tablet computer, a smart phone, a wearable device, a server, a workstation, and/or the like, and the electronic devices 1100 and 1200 may include electronic circuits/devices which are assembled/embedded/mounted in the electronic system 1000.

In some example embodiments, the electronic system 1000 may be implemented in a plurality of electronic devices, and the electronic devices 1100 and 1200 may be implemented in separate electronic devices. For example, each of the electronic devices 1100 and 1200 may include one of various electronic devices, such as a desktop computer, a laptop computer, a tablet computer, a smart phone, a wearable device, a server, a workstation, and/or the like. The electronic devices 1100 and 1200 may include electronic devices of the same type or electronic devices of different types.

Figure 2:
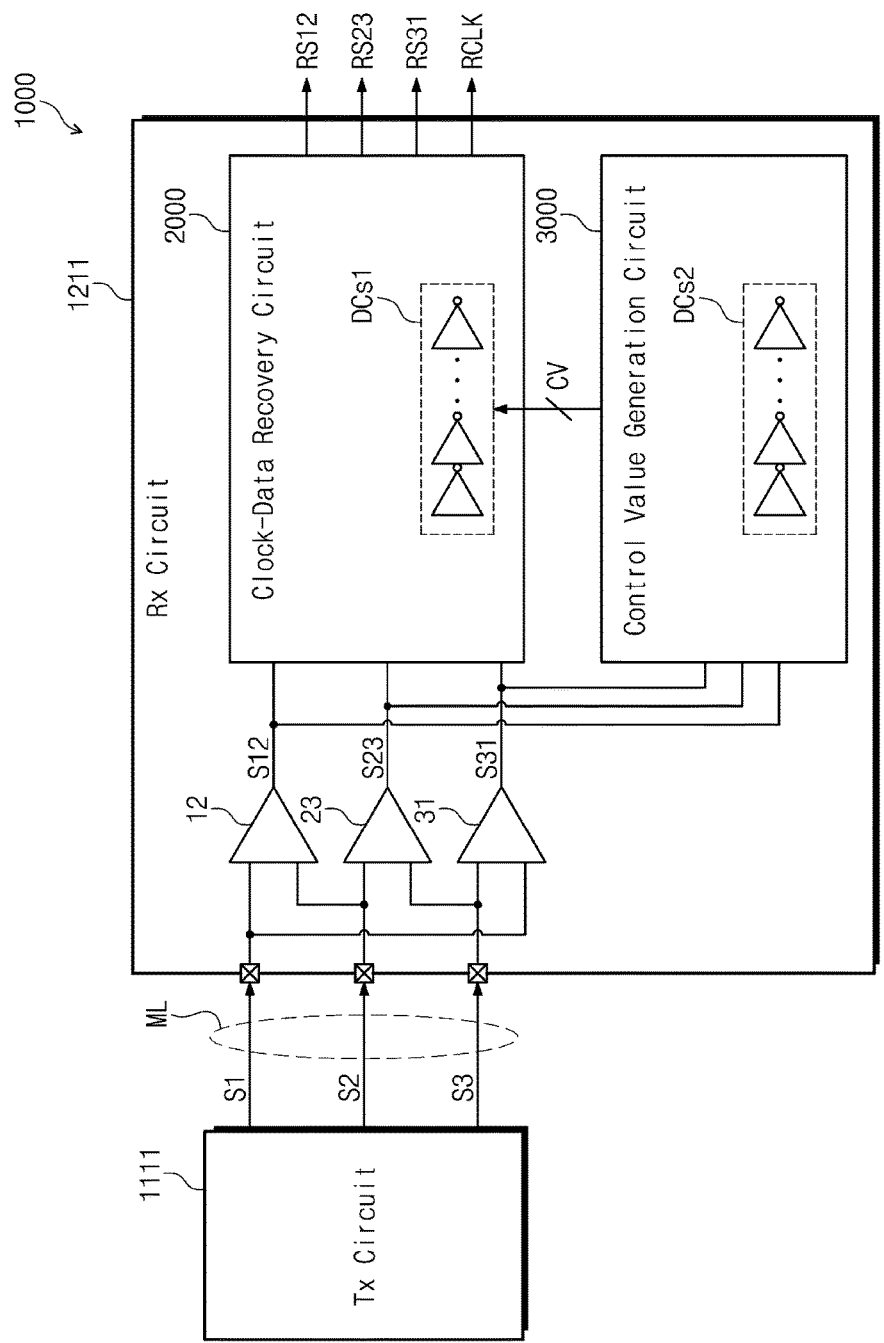
FIG. 2 is a block diagram illustrating an example configuration of a reception circuit of FIG. 1 in more detail.

FIG. 2 is a block diagram illustrating an example configuration of a reception circuit of FIG. 1 in more detail. To facilitate better understanding, an example configuration of the reception circuit 1211 of FIG. 1 will be described. In some example embodiments, the reception circuit 1115 of FIG. 1 may be configured to be the same as or similar to the reception circuit 1211.

In the example embodiments, the reception circuit 1211 may receive signals from the transmission circuit 1111, through three or more communication lines. For example, the reception circuit 1211 may receive transmission signals S1, S2, and S3, from three (3) communication lines ML. The transmission signals S1, S2, and S3 may include signals, which are output from the transmission circuit 1111 and transmitted to the reception circuit 1211 along the communication lines ML.

For example, when each of the transmission circuit 1111 and the reception circuit 1211 is included in a physical layer that is defined in a C-PHY specification proposed by the mobile industry processor interface (MIPI) alliance, the reception circuit 1211 may communicate with the transmission circuit 1111 through the three communication lines ML. However, this example is to facilitate better understanding, and the present disclosure is not limited thereto. The transmission circuit 1111 and the reception circuit 1211 may comply with any other physical layer specification(s) and any other interface protocol(s) which are associated with communication through three or more communication lines.

In the present disclosure, three communication lines ML and three transmission signals S1, S2, and S3 will be described. However, such descriptions are to facilitate better understanding, and the present disclosure is not limited to three communication lines ML and three transmission signals S1, S2, and S3. It may be readily understood from the following descriptions that the example embodiments may be modified or changed for four or more communication lines and four or more transmission signals.

In some example embodiments, the reception circuit 1211 may include a plurality of buffers 12, 23, and 31, a clock-data recovery circuit 2000, and a control value generation circuit 3000. In some example embodiments, the buffers 12, 23, and 31 and/or the control value generation circuit 3000 may be provided outside the reception circuit 1211. The present disclosure is not limited to the illustration of FIG. 2.

The buffers 12, 23, and 31 may receive transmission signal pairs, which are differently selected from the transmission signals S1, S2, and S3. For example, the buffer 12 may receive a pair of transmission signals S1 and S2, and the buffer 23 may receive a pair of transmission signals S2 and S3. Meanwhile, the buffer 31 may receive a pair of transmission signals S3 and S1. The buffers 12, 23, and 31 may receive different transmission signal pairs.

The buffers 12, 23, and 31 may output reception signals S12, S23, and S31, based on received transmission signal pairs. For example, the buffers 12, 23, and 31 may include differential buffers. For example, the buffer 12 may output the reception signal S12 based on the pair of transmission signals S1 and S2 (e.g., based on a difference between levels of the transmission signals S1 and S2). Meanwhile, the buffer 23 may output the reception signal S23 based on the pair of transmission signals S2 and S3, and the buffer 31 may output the reception signal S31 based on the pair of transmission signals S3 and S1.

FIG. 2 illustrates three buffers 12, 23, and 31. However, the number of buffers may be variously modified or changed depending on the number of communication lines and the number of transmission signals. For example, when four communication lines are used, six ($=_4C_2$) buffers may be provided to receive transmission signal pairs which are differently selected from four transmission signals, and six reception signals may be output.

The clock-data recovery circuit 2000 may receive the reception signals S12, S23, and S31. The clock-data recovery circuit 2000 may output a recovered clock RCLK, based on a transition generated in the reception signals S12, S23, and S31. The clock-data recovery circuit 2000 may output recovered signals RS12, RS23, and RS31, based on the recovered clock RCLK and the reception signals S12, S23, and S31.

In the example embodiments, the recovered clock RCLK may have edges that are suitable to generate the recovered signals RS12, RS23, and RS31 from the reception signals S12, S23, and S31. Accordingly, the clock-data recovery circuit 2000 may generate (e.g., sample) the recovered signals RS12, RS23, and RS31, based respectively on the reception signals S12, S23, and S31, in response to the recovered clock RCLK.

The recovered clock RCLK may be used to generate the recovered signals RS12, RS23, and RS31. In some example embodiments, the recovered clock RCLK may be provided to other components (e.g., a processor/controller, a display driver, a memory device, and/or the like) of the second electronic device 1200 of FIG. 1. For example, the recovered clock RCLK may be further used as an operation clock for operating all or some of components of the second electronic device 1200.

The recovered signals RS12, RS23, and RS31 may be processed by the encoder/decoder circuit 1213 of FIG. 1. Accordingly, the encoder/decoder circuit 1213 may output the reception data Rx_DAT. The recovered signals RS12, RS23, and RS31 for the reception data Rx_DAT will be described with reference to FIG. 3.

The clock-data recovery circuit 2000 may include a first plurality of delay cells DCs1. Each delay cell of the first plurality of delay cells DCs1 may be configured to delay transmission of any signal. In some example embodiments, each delay cell may delay transmission of the recovered clock RCLK. In some example embodiments, each delay cell may delay transmission of the recovered signals RS12, RS23, and RS31.

In the example embodiments, a signal delay through the first plurality of delay cells DCs1 may be adjusted (e.g., may get longer or shorter) based on a control value CV. Generating and delaying the recovered clock RCLK and the recovered signals RS12, RS23, and RS31 will be described with reference to FIGS. 4 and 5. In addition, example configurations and operations of the clock-data recovery circuit 2000 will be described with reference to FIGS. 13 to 21.

The control value generation circuit 3000 may generate the control value CV. The control value CV may be provided for the first plurality of delay cells DCs1 of the clock-data recovery circuit 2000.

In some example embodiments, the control value CV may include a plurality of bits for activating or deactivating the first plurality of delay cells DCs1 respectively. Some of the first plurality of delay cells DCs1 may be activated to delay any signal, and the remaining delay cells thereof may be deactivated and may not delay a signal. Accordingly, a signal delay through the first plurality of delay cells DCs1 may be adjusted depending on the number of activated delay cells.

The control value generation circuit 3000 may include a second plurality of delay cells DCs2. The control value generation circuit 3000 may output the control value CV based on an output from the second plurality of delay cells DCs2. Each delay cell of the second plurality of delay cells DCs2 may be configured to delay transmission of any signal.

For example, the control value generation circuit 3000 may calculate a suitable delay of the first plurality of delay cells DCs1, based on the output from the second plurality of delay cells DCs2. In addition, the control value generation circuit 3000 may provide the first plurality of delay cells DCs1 with the control value CV which allows the calculated delay. To this end, in some example embodiments, the second plurality of delay cells DCs2 may be configured such that connection between logic gates included in each delay cell of the second plurality of delay cells DCs2 is the same as connection between logic gates included in each delay cell of the first plurality of delay cells DCs1. That is, logic gates included in each delay cell of the second plurality of delay cells DCs2 may be connected to each other to replicate a connection between logic gates included in each delay cell of the first plurality of delay cells DCs1.

In some example embodiments, the control value generation circuit 3000 may generate the control value CV based on the reception signals S12, S23, and S31. However, in some example embodiments, the control value generation circuit 3000 may generate the control value CV without the reception signals S12, S23, and S31. In the latter example embodiments, unlike that illustrated in FIG. 2, the control value generation circuit 3000 may not receive the reception signals S12, S23, and S31. Example configurations and operations of the control value generation circuit 3000 will be described with reference to FIGS. 6A to 12.

Figure 3:
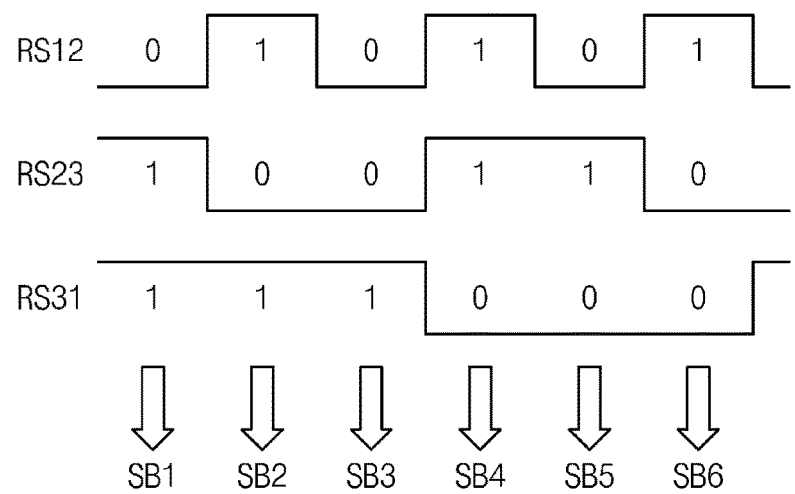
FIG. 3 is a conceptual diagram for describing data symbols processed by an encoder/decoder circuit of FIG. 1.

FIG. 3 is a conceptual diagram for describing data symbols processed by the encoder/decoder circuit of FIG. 1.

The reception circuit 1211 of FIGS. 1 and 2 may output the recovered signals RS12, RS23, and RS31. Each of the recovered signals RS12, RS23, and RS31 may have values of logic "0" and logic "1". The encoder/decoder circuit 1213 of FIG. 1 may decode the recovered signals RS12, RS23, and RS31 to data symbols, based on logic values of the recovered signals RS12, RS23, and RS31. The data symbols may correspond to data that the transmission circuit 1111 of FIG. 1 intends to transmit by using the transmission signals S1, S2, and S3. The encoder/decoder circuit 1213 may output the reception data Rx_DAT based on the decoded data symbols.

For example, when the recovered signal RS12 has a value of logic "0" and each of the recovered signals RS23 and RS31 has a value of logic "1", the encoder/decoder circuit 1213 may decode the recovered signals RS12, RS23, and RS31 to a data symbol SB1. In such a manner, the encoder/decoder circuit 1213 may decode the recovered signals RS12, RS23, and RS31 to data symbols SB1, SB2, SB3, SB4, SB5, and SB6, according to changes in logic values of the recovered signals RS12, RS23, and RS31. The data symbols SB1, SB2, SB3, SB4, SB5, and SB6 may be decoded based on different logic values of the recovered signals RS12, RS23, and RS31 respectively.

Figure 4:
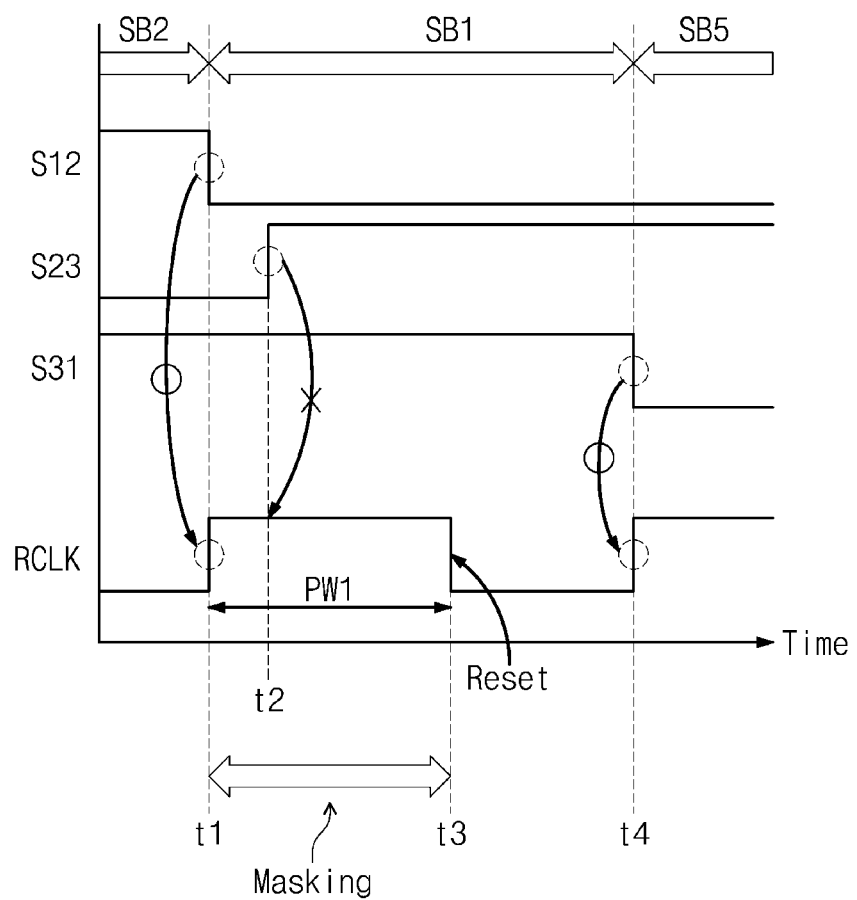
FIGS. 4 and 5 are timing diagrams for describing an example operation of a clock-data recovery circuit of FIG. 2.
Figure 5:
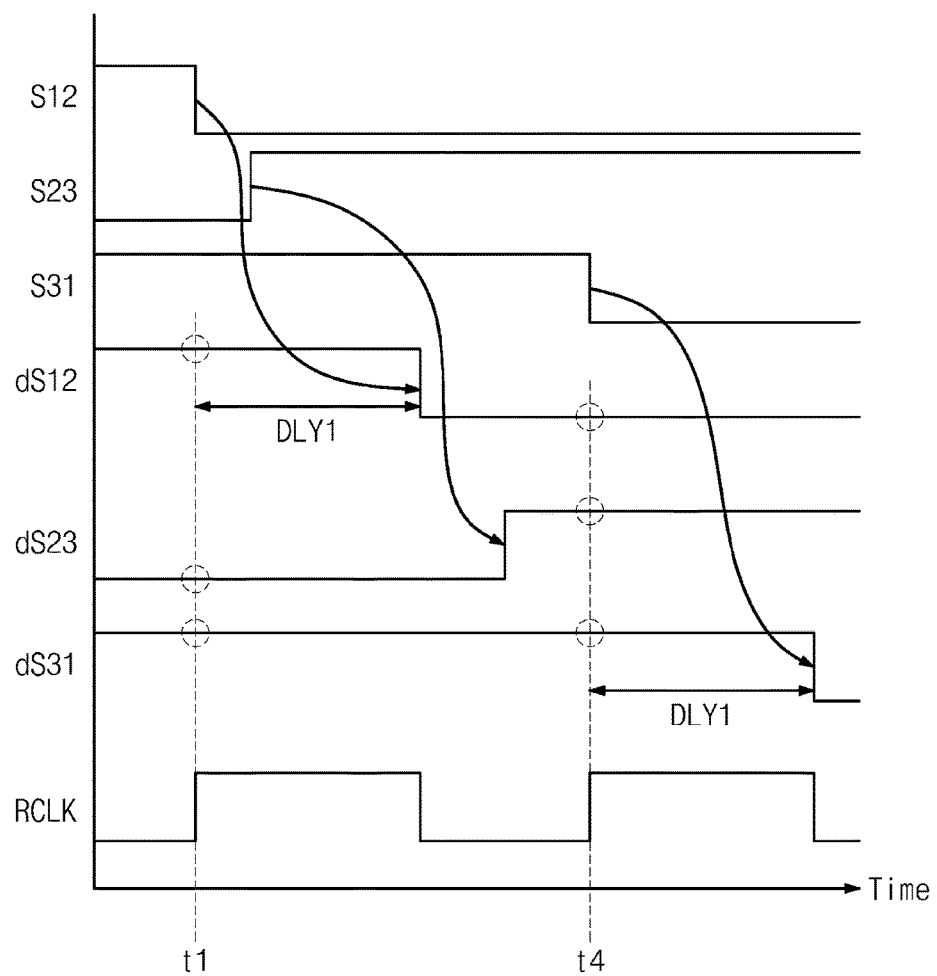

FIGS. 4 and 5 are timing diagrams for describing an example operation of the clock-data recovery circuit of FIG. 2.

Referring to FIG. 4, for example, before time "t1", the reception signals S12 and S31 may have values of logic "1", and the reception signal S23 may have a value of logic "0". Accordingly, before time "t1", the clock-data recovery circuit 2000 of FIG. 2 may receive the reception signals S12, S23, and S31 that are associated with the data symbol SB2.

For example, from time "t1", the clock-data recovery circuit 2000 may receive the reception signals S12, S23, and S31 that are associated with the data symbol SB1. For example, in regards to the data symbol SB1, the reception signal S12 may transition from a state of logic "1" to a state of logic "0" at time "t1". The clock-data recovery circuit 2000 may provide a first edge (e.g., a rising edge) of the recovered clock RCLK, in response to the transition of the reception signal S12.

In regards to the data symbol SB1, the reception signal S23 may transition from a state of logic "0" to a state of logic "1". In some cases, the transition of the reception signal S23 may occur together with the transition of the reception signal S12. However, in some cases, the reception signal S23 may transition differently from the reception signal S12, due to a communication condition (e.g., a manufacturing process error, a voltage pulling delay, temperature variation, and/or the like).

For example, at time "t2" after time "t1", the reception signal S23 may transition from a state of logic "0" to a state of logic "1". However, the transition of the reception signal S23 at time "t2" may not affect the recovered clock RCLK. The reason is because the transition of the reception signal S23 at time "t2" is associated with the data system SB1 together with the transition of the reception signal S12 at time "t1". Meanwhile, in regards to the data symbol SB1, the reception signal S31 may not transition (i.e., may remain a value of logic "1").

At time "t3", the clock-data recovery circuit 2000 may provide a second edge (e.g., a falling edge) of the recovered clock RCLK in response to a reset signal. The clock-data recovery circuit 2000 may generate the reset signal by delaying the recovered clock RCLK through the first plurality of delay cells DCs1 of FIG. 2. The reset signal will be described with reference to FIGS. 13 to 21. The recovered clock RCLK may have the second edge in response to the reset signal, to have the first edge in regards to a next data symbol following the data symbol SB1.

Accordingly, the recovered clock RCLK may have a pulse width PW1. In addition, any following transition (e.g., the transition of the reception signal S23 at time "t2") after initial transition (e.g., the transition of the reception signal S12 at time "t1") may be masked between time "t1" and time "t3". A time interval between time "t1" and time "t3" may provide a masking period. The following transition(s) after the initial transition may not affect the recovered clock RCLK in the masking period.

The reception signals S12, S23, and S31 corresponding to one data symbol SB1 may be received in a time interval between time "t1" and time "t4". The time interval between time "t1" and time "t4" may provide a symbol period that is defined by the reception signals S12, S23, and S31 in regards to one data symbol.

For example, from time "t4", the clock-data recovery circuit 2000 may receive the reception signals S12, S23, and S31 that are associated with the data symbol SB5. For example, in regards to the data symbol SB5, the reception signal S31 may transition from a state of logic "1" to a state of logic "0" at time "t4". The clock-data recovery circuit 2000 may provide the first edge of the recovered clock RCLK in response to the transition of the reception signal S31. Meanwhile, in regards to the data symbol SB5, the reception signals S12 and S23 may not transition (i.e., may remain previous logic values).

In such a manner, the clock-data recovery circuit 2000 may generate the recovered clock RCLK, based on the reception signals S12, S23, and S31 and the reset signal. Transition may be generated at least once in the reception signals S12, S23, and S31 in each and every symbol period to generate the recovered clock RCLK. During one symbol period, each of the first edge and the second edge of the recovered clock RCLK may be generated once.

Referring to FIG. 5, the clock-data recovery circuit 2000 may use the recovered clock RCLK to generate (e.g., sample) the recovered signals RS12, RS23, and RS31 of FIG. 2 based on the reception signals S12, S23, and S31. However, for example, timing of the first edge (e.g., at time "t1" and time "t4") of the recovered clock RCLK may not be suitable to sample the reception signals S12, S23, and S31.

Accordingly, the clock-data recovery circuit 2000 may delay the reception signals S12, S23, and S31 as much as a delay DLY1 through the first plurality of delay cells DCs1. The clock-data recovery circuit 2000 may delay the reception signals S12, S23, and S31 to generate delayed reception signals dS12, dS23, and dS31. The clock-data recovery circuit 2000 may stably sample the delayed reception signals dS12, dS23, and dS31 in response to the first edge of the recovered clock RCLK. The clock-data recovery circuit 2000 may output the recovered signals RS12, RS23, and RS31 based on the sampled results.

As described with reference to FIGS. 4 and 5, the first plurality of delay cells DCs1 may be employed to control various timings, such as a reset timing for providing the second edge of the recovered clock RCLK, a sampling timing for sampling the reception signals S12, S23, and S31, and/or the like. The first plurality of delay cells DCs1 may delay the recovered clock RCLK and/or the reception signals S12, S23, and S31 to provide suitable timings of various operations.

Meanwhile, when a communication condition is changed (e.g., change in a data rate of the transmission signals S1, S2, and S3 and/or the reception signals S12, S23, and S31, process-voltage-temperature (PVT) variation, and/or the like), it may be required to change various timings, such as a reset timing, a sampling timing, and/or the like. For example, when a data rate of the transmission signals S1, S2, and S3 becomes higher, it may be required to make a reset timing for providing the second edge of the recovered clock RCLK earlier. For this reason, when the first plurality of delay cells DCs1 delays a signal by a fixed time length, it may be impossible to change/adjust various timings suitably in response to change in the communication condition.

Accordingly, in the example embodiments, a signal delay through the first plurality of delay cells DCs1 may be adjusted based on the control value CV. The control value CV may allow the first plurality of delay cells DCs1 to delay a signal as much as a delay length that is optimized for the changed communication condition. The control value generation circuit 3000 of FIG. 2 may generate the control value CV which allows an optimized delay of the first plurality of delay cells DCs1, by means of the second plurality of delay cells DCs2.

According to the example embodiments, even if a communication condition is changed, the reception circuit 1211 of FIG. 2 may suitably provide edges of the recovered clock RCLK, based on a delay which is optimized for the changed communication condition. Accordingly, the recovered clock RCLK of the example embodiments may provide an optimal setup/hold period even in any communication condition, and the reception circuit 1211 may stably output the recovered signals RS12, RS23, and RS31 based on the recovered clock RCLK.

Figure 6A:
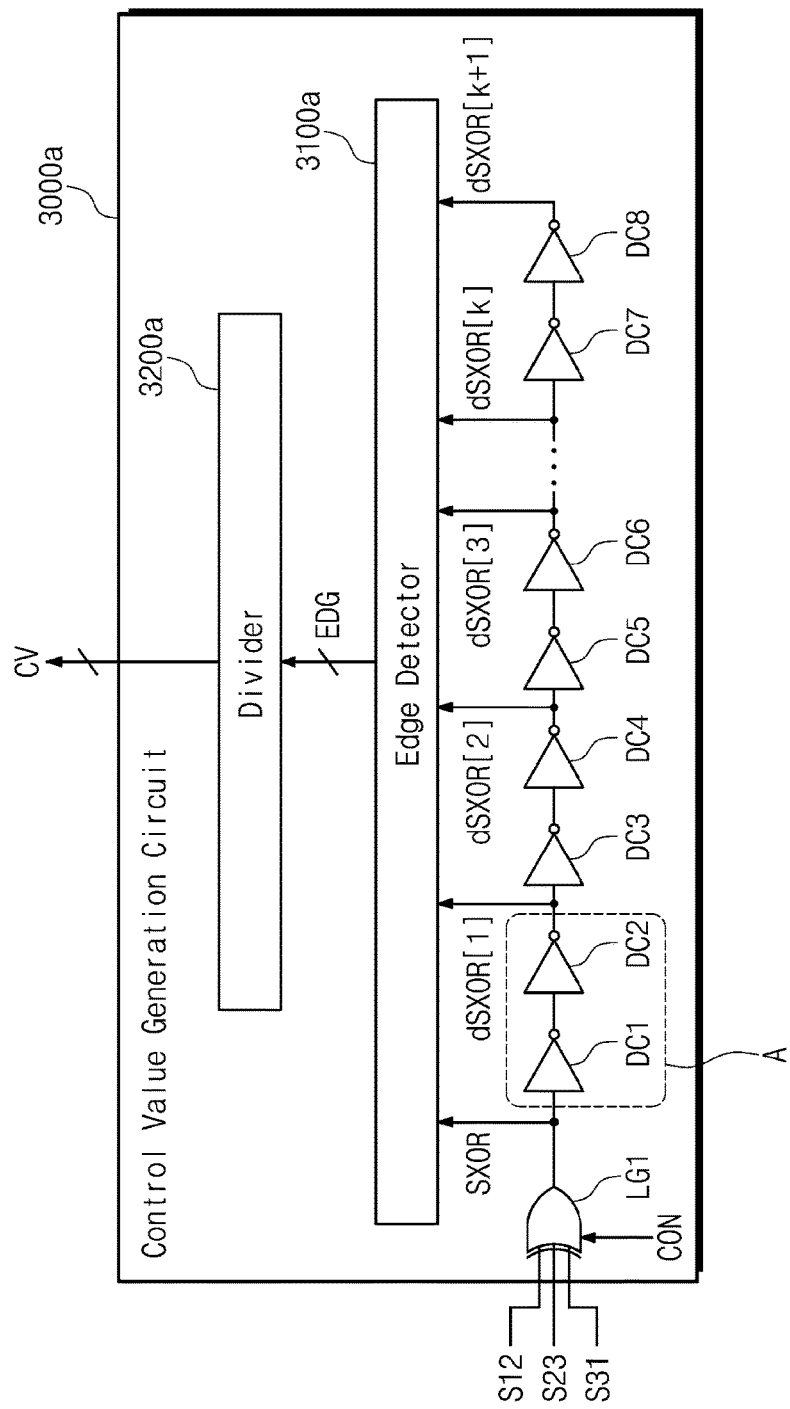
FIGS. 6A and 6B are block diagrams illustrating an example configuration of a control value generation circuit of FIG. 2.
Figure 6B:
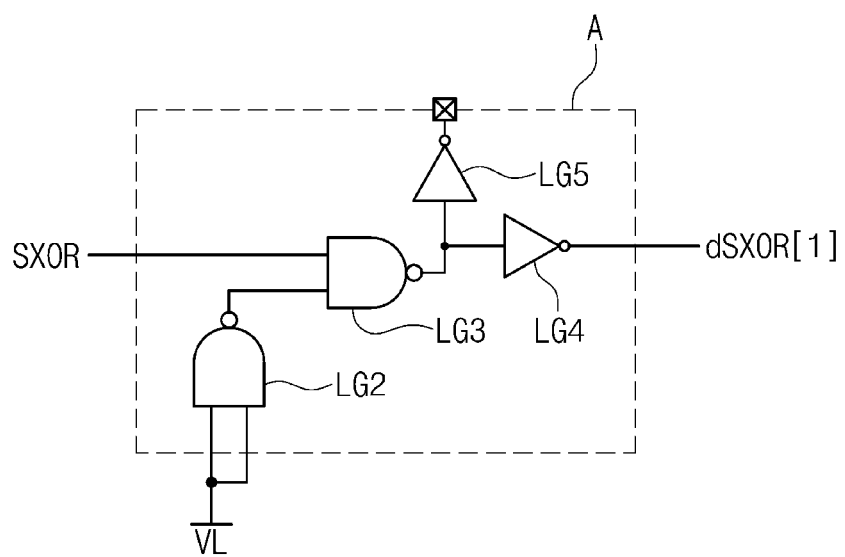

FIGS. 6A and 6B are block diagrams illustrating an example configuration of the control value generation circuit of FIG. 2. In some example embodiments, the control value generation circuit 3000 of FIG. 2 may include a control value generation circuit 3000a of FIG. 6A.

Referring to FIG. 6A, the control value generation circuit 3000a may include a logic circuit that combines the reception signals S12, S23, and S31. For example, the logic circuit may include a logic gate LG1. Herein, the terms "combine" and "combination" may be associated with performing a logical operation on logic values of some signals.

The logic gate LG1 may combine the reception signals S12, S23, and S31 to output a combination signal SXOR. For example, the combination signal SXOR may correspond to an exclusive logical OR of logic values of the reception signals S12, S23, and S31. For example, the logic gate LG1 may output or may not output the combination signal SXOR in response to a control signal CON.

The control value generation circuit 3000a may include delay cells DC1 to DC8. The delay cells DC1 to DC8 may correspond to the second plurality of delay cells DCs2 of FIG. 2. The delay cells DC1 to DC8 may output a plurality of delayed combination signals dSXOR[1] to dSXOR[k+1] based on the combination signal SXOR. The delay cells DC1 to DC8 may generate the plurality of delayed combination signals dSXOR[1] to dSXOR[k+1] by differently delaying the combination signal SXOR.

Referring to FIGS. 6A and 6B, in some example embodiments, a circuit "A" corresponding to the delay cells DC1 and DC2 may include logic gates LG2 to LG5. The logic gate LG2 may receive a driving voltage VL which has a level corresponding to logic "0". The logic gate LG3 may receive the output of the logic gate LG2 and the combination signal SXOR. The logic gate LG4 may receive the output of the logic gate LG3, and may output the delayed combination signal dSXOR[1]. The logic gate LG5 may receive the output of the logic gate LG3, and the output of the logic gate LG5 may be stabilized appropriately in consideration of a circuit operation characteristic.

The combination signal SXOR may be delayed while passing through the logic gates LG2, LG3, and LG4. Herein, the terms "pass" and "passing through" may not mean physical delivering, but may mean that the combination signal SXOR affects outputs of the logic gates LG3 and LG4. The output of the logic gate LG4 may be transferred to the delay cell DC3.

Each of the delay cells DC3 and DC4, the delay cells DC5 and DC6, and the delay cells DC7 and DC8 may be configured to be similar to the circuit "A". The delay cells DC3 to DC8 may include logic gates that are connected to be the same as the logic gates LG2, LG3, LG4, and LG5 of the circuit "A". Accordingly, the combination signal SXOR may be delayed more and more while passing through the logic gates DC3 to DC8. The delay cells DC1 to DC8 may output the plurality of delayed combination signals dSXOR[1] to dSXOR[k+1], which are differently delayed.

However, the configuration of the circuit "A" described with reference to FIG. 6B is only an example to facilitate better understanding. The configurations of the delay cells DC1 to DC8 may be variously modified or changed to delay the combination signal SXOR.

Returning to FIG. 6A, the control value generation circuit 3000a may include an edge detector 3100a. The edge detector 3100a may output a detection value EDG based on the combination signal SXOR and the plurality of delayed combination signals dSXOR[1] to dSXOR[k+1]. For example, the detection value EDG may include a plurality of bits. The bits of the detection value EDG may include a bit indicating an edge of the combination signal SXOR. Outputs of the delay cells DC1 and DC8 will be further described with reference to FIG. 7.

The control value generation circuit 3000a may include a divider 3200a. The divider 3200a may output the control value CV based on the detection value EDG. For example, the divider 3200a may generate bits of the control value CV by combining a reference number of bits among the bits of the detection value EDG. Accordingly, the control value generation circuit 3000a may output the control value CV that is optimized for the first plurality of delay cells DCs1 of FIG. 2.

FIG. 7 is a timing diagram for describing an example operation of the control value generation circuit of FIG. 6A. To facilitate better understanding, FIG. 7 will be described together with FIG. 6A.

The combination signal SXOR may be based on a combination of the reception signals S12, S23, and S31. The control value generation circuit 3000a may receive the reception signals S12, S23, and S31 that allow the combination signal SXOR to transition in each and every time interval corresponding to a length of one symbol period.

For example, in a preamble period defined in the C-PHY specification, only one of the reception signals S12, S23, and S31 may transition during one symbol period (e.g., when the reception signal S12 transitions during one symbol period, the reception signals S23 and S31 may not transition during the corresponding symbol period). Accordingly, when the logic gate LG1 combines the reception signals S12, S23, and S31 associated with the preamble period, the combination signal SXOR may transition in each and every time interval corresponding to a length of one symbol period.

The combination signal SXOR may be provided to the delay cells DC1 to DC8 in response to activation of the control signal CON. Accordingly, the delay cells DC1 to DC8 may output the plurality of delayed combination signals dSXOR[1] to dSXOR[k+1]. As described with reference to FIG. 6A, the plurality of delayed combination signals dSXOR[1] to dSXOR[k+1] may be generated by delaying the combination signal SXOR differently.

The plurality of delayed combination signals dSXOR[1] to dSXOR[k+1] may be used to detect an edge of the combination signal SXOR. For example, at time "t5", the edge detector 3100a may refer to the combination signal SXOR and the delayed combination signal dSXOR[j]. In addition, at time "t6", the edge detector 3100a may refer to the combination signal SXOR and the delayed combination signal dSXOR[j+1].

For example, the delayed combination signal dSXOR[j] may have a value of logic "1" from time "t5", and the delayed combination signal dSXOR[j+1] may have a value of logic "1" from time "t6". Meanwhile, the combination signal SXOR may have a value of logic "1" at time "t5" and may have a value of logic "0" at time "t6". Accordingly, it may be determined that there is an edge of the combination signal SXOR between time "t5" and time "t6", with reference to the combination signal SXOR, the delay combination signal dSXOR[j], and the delayed combination signal dSXOR[j+1].

The edge detector 3100a may logically combine the combination signal SXOR and the delayed combination signals dSXOR[1] to dSXOR[k+1]. The edge detector 3100a may output the detection value EDG as the result of the logical combination.

For example, the detection value EDG may include a plurality of bits. For example, the edge detector 3100a may generate one bit included in the detection value EDG by combining the combination signal SXOR, the delay combination signal dSXOR[j], and the delayed combination signal dSXOR[j+1]. The one bit may indicate an edge of the combination signal SXOR. However, other bits of the detection value EDG except for the one bit may not indicate an edge of the combination signal SXOR. For example, since the delayed combination signals dSXOR[1] and dSXOR[2] transition in a time interval in which no edge of the combination signal SXOR exists, a bit of the detection value EDG, which is generated by combining the combination signal SXOR, the delay combination signal dSXOR[1], and the delayed combination signal dSXOR[2], may not indicate an edge of the combination signal SXOR.

In such a manner, the detection value EDG may include a bit that indicates an edge of the combination signal SXOR and bits that are not associated with an edge of the combination signal SXOR. Since the combination signal SXOR transitions in each and every time interval corresponding to a length of one symbol period, a position of the bit, which indicates an edge of the combination signal SXOR, may be associated with a length of one symbol period.

The length of the symbol period may be changed depending on a communication condition (e.g., a data rate of the transmission signals S1, S2, and S3 and/or the reception signals S12, S23, and S31, PVT variation, and/or the like). Consequently, a position indicating an edge of the combination signal SXOR and the detection value EDG may be changed depending on the communication condition. This means that a change in the detection value EDG may be associated with a change in the communication condition. Accordingly, when the control value CV is provided based on the detection value EDG, the control value CV may also be associated with a change in the communication condition.

Meanwhile, the control value CV may be used to adjust a delay of the first plurality of delay cells DCs1 of FIG. 2. In addition, the recovered clock RCLK may be reset by a reset signal that is generated based on a delay of the recovered clock RCLK through the first plurality of delay cells DCs1 (refer to FIG. 4). That is, to reset the recovered clock RCLK before the following symbol period, the control value CV may be associated with a time length that is shorter than a length of one symbol period.

Accordingly, it may be inappropriate to output the detection value EDG as the control value CV without change. The divider 3200a may be provided to convert the detection value EDG into the suitable control value CV that is required for the first plurality of delay cells DCs1. The converted control value CV may be provided to the clock-data recovery circuit 2000.

As an assumption to facilitate better understanding, it may be required to reset the recovered clock RCLK at a time point corresponding to a quarter of one symbol period. Under the assumption, the control value CV may be generated such that the first plurality of delay cells DCs1 delays a signal as much as a time length corresponding to approximately a quarter of one symbol period. To this end, for example, the divider 3200a may combine four (4) bits among the bits of the detection value EDG to generate respective bits included in the control value CV (i.e., the reference number is 4). In this case, the control value CV may include a bit that is associated with a time length corresponding to a quarter of one symbol period.

In some example embodiments, the control value generation circuit 3000a described with reference to FIGS. 6A to 7 may operate whenever suitable reception signals S12, S23, and S31 are received (e.g., whenever the reception signals S12, S23, and S31 associated with the preamble period are received). In some example embodiments, the control value generation circuit 3000a may operate periodically, or may operate when a specific condition is satisfied.

Figure 8:
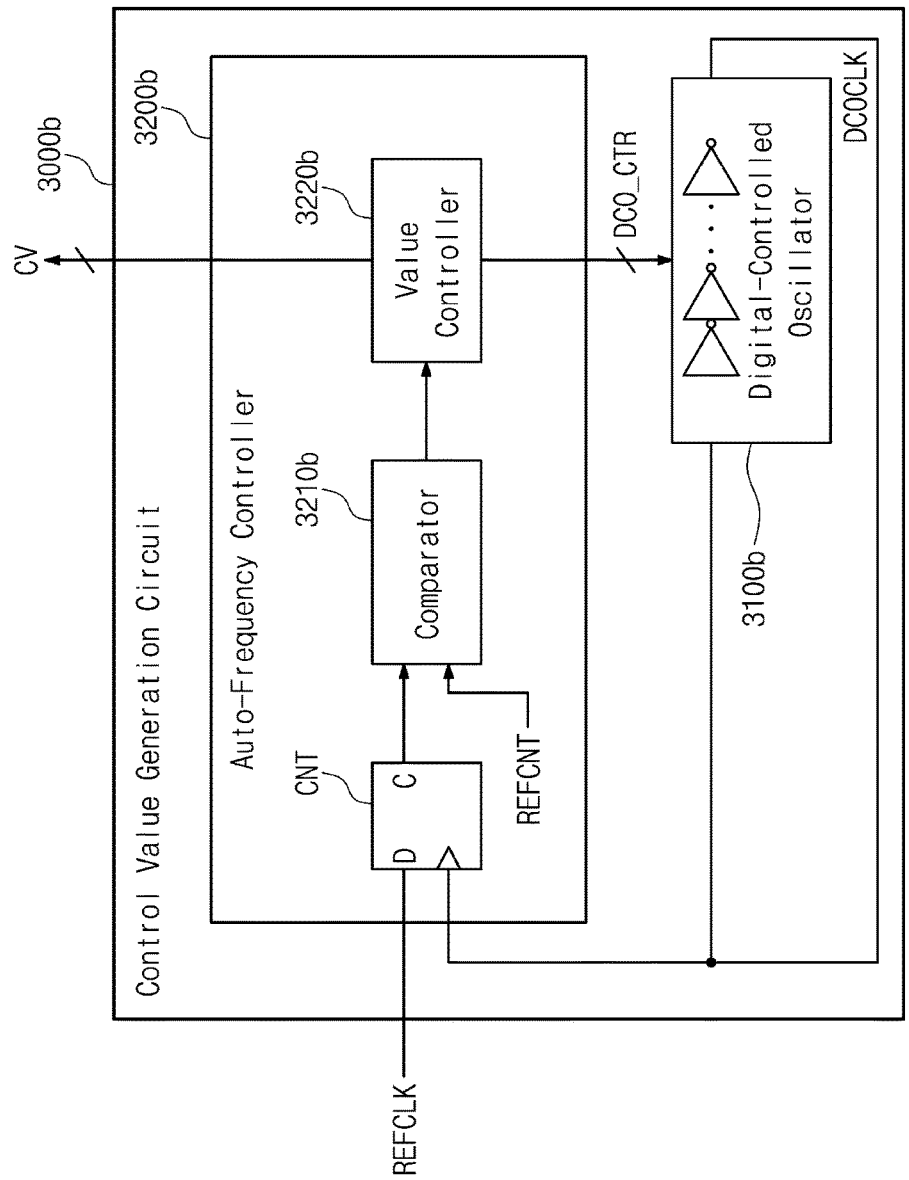
FIG. 8 is a block diagram illustrating an example configuration of a control value generation circuit of FIG. 2.

FIG. 8 is a block diagram illustrating an example configuration of the control value generation circuit of FIG. 2. In some example embodiments, the control value generation circuit 3000 of FIG. 2 may include a control value generation circuit 3000b of FIG. 8.

The control value generation circuit 3000b may include a digital-controlled oscillator 3100b. The digital-controlled oscillator 3100b may correspond to the second plurality of delay cells DCs2 of FIG. 2. The digital-controlled oscillator 3100b may generate an oscillation clock DCOCLK along an internal oscillation loop through the second plurality of delay cells DCs2. The digital-controlled oscillator 3100b will be further described with reference to FIGS. 9 and 10.

The control value generation circuit 3000b may include an auto-frequency controller 3200b. The auto-frequency controller 3200b may output an oscillation control value DCO_CTR based on a reference clock REFCLK and the oscillation clock DCOCLK. The oscillation control value DCO_CTR may be used to adjust a delay of the second plurality of delay cells DCs2 of the digital-controlled oscillator 3100b. A frequency of the oscillation clock DCOCLK may be changed according to a delay of the second plurality of delay cells DCs2, that is, may be adjusted based on the oscillation control value DCO_CTR.

For example, the oscillation control value DCO_CTR may include a plurality of bits for activating or deactivating the second plurality of delay cells DCs2 respectively. Some of the second plurality of delay cells DCs2 may be activated to delay any signal, and the remaining delay cells thereof may be deactivated and may not delay a signal. Accordingly, a signal delay through the second plurality of delay cells DCs2 may be adjusted depending on the number of activated delay cells.

The auto-frequency controller 3200b may output the control value CV based on the oscillation control value DCO_CTR. Consequently, the auto-frequency controller 3200b may output the control value CV based on a frequency of the oscillation clock DCOCLK. As described above, the control value CV may be used to adjust a delay of the first plurality of delay cells DCs1 of FIG. 2. The control value generation circuit 3000b may operate without the reception signals S12, S23, and S31 of FIG. 2.

In some example embodiments, the auto-frequency controller 3200b may include a logic circuit that counts transition of the oscillation clock DCOCLK during a reference period of the reference clock REFCLK. For example, the logic circuit may include a counter CNT. The counter CNT may output a transition count C based on the reference clock REFCLK and the oscillation clock DCOCLK. For example, a value of the transition count C may increase based on the reference clock REFCLK whenever the oscillation clock DCOCLK transitions. Accordingly, the counter CNT may output the transition count C associated with the number of times where the oscillation clock DCOCLK transitions.

In some example embodiments, the auto-frequency controller 3200b may include a comparator 3210b that compares the transition count C with a reference count REFCNT to output a comparison result. The reference count REFCNT may indicate a value of the transition count C that is suitable for an intended communication condition. In some example embodiments, the auto-frequency controller 3200b may include a value controller 3220b that outputs the oscillation control value DCO_CTR or the control value CV based on the comparison result from the comparator 3210b. The auto-frequency controller 3200b will be further described with reference to FIGS. 11 and 12.

Figure 9:
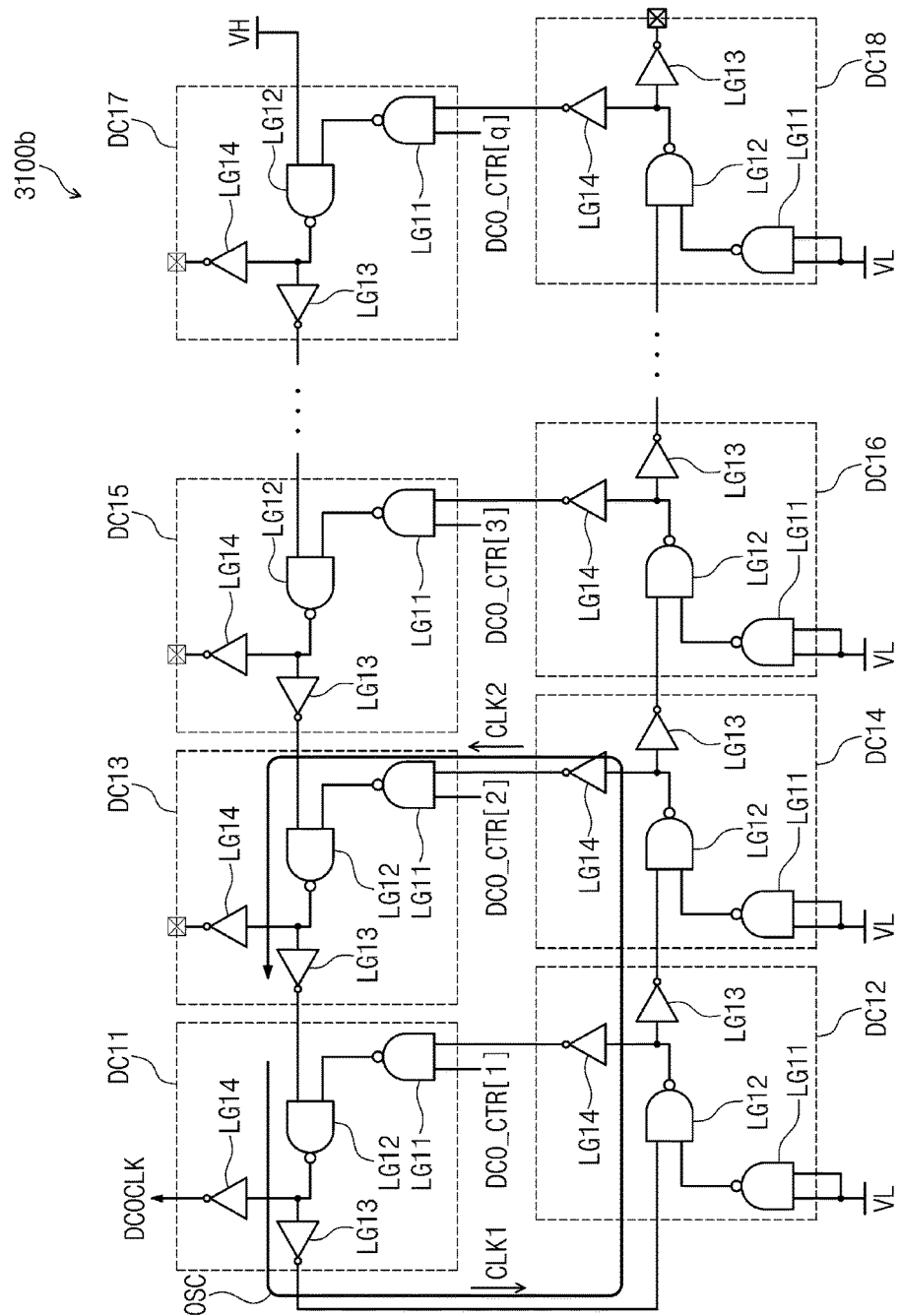
FIG. 9 is a block diagram illustrating an example configuration of a digital-controlled oscillator of FIG. 8.
Figure 10:
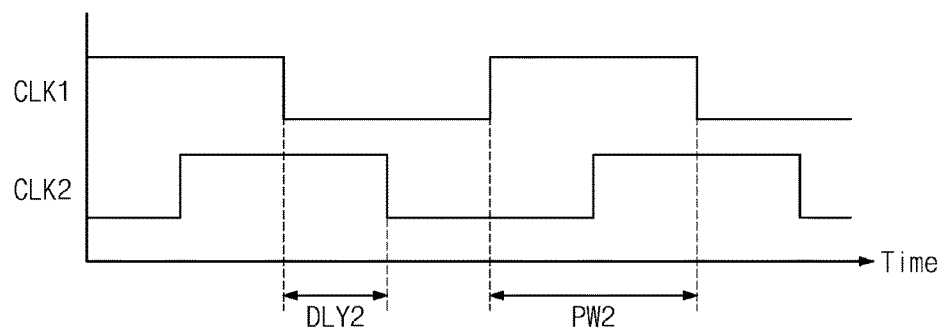
FIG. 10 is a timing diagram for describing an example operation of a digital-controlled oscillator of FIG. 9.

FIG. 9 is a block diagram illustrating an example configuration of the digital-controlled oscillator of FIG. 8. FIG. 10 is a timing diagram for describing an example operation of the digital-controlled oscillator of FIG. 9. To facilitate better understanding, FIGS. 9 and 10 will be described together with FIG. 8.

Referring to FIG. 9, the digital-controlled oscillator 3100b may include delay cells DC11 to DC18. The delay cells DC11 to DC18 may correspond to the second plurality of delay cells DCs2 of FIG. 2. For example, each of the delay cells DC11 to DC18 may include logic gates LG11 to LG14, but configurations of the delay cells DC11 to DC18 may be variously changed or modified to delay a signal. In each delay cell, the connection between the logic gates LG11 to LG14 may be similar to the connection between the logic gates LG2 to LG5 described with reference to FIG. 6B, thus detailed descriptions thereof will be omitted below for brevity.

The oscillation control value DCO_CTR may include a plurality of bits DCO_CTR[1] to DCO_CTR[q]. The delay cells DC11, DC13, DC15, and DC17 may be respectively activated or deactivated by the bits DCO_CTR[1], DCO_CTR[2], DCO_CTR[3], and DCO_CTR[q]. The delay cells DC12, DC14, DC16, and DC18 may provide a delay path based on the driving voltage VL.

As an assumption to facilitate better understanding, the bit DCO_CTR[2] of the oscillation control value DCO_CTR may have a value of logic "1" and other bits DCO_CTR[1] and DCO_CTR[3] to DCO_CTR[q] may have values of logic "0". Under the assumption, the delay cells DC11 to DC14 may provide an internal oscillation loop OSC in the sequence of the delay cells DC11, DC12, DC14, DC13, and DC11. However, other delay cells DC15, DC16, DC17, and DC18 may not be included in the internal oscillation loop OSC.

Internal clocks CLK1 and CLK2 may be generated along the internal oscillation loop OSC, based on the driving voltage VH which has a level corresponding to logic "1". Referring to FIG. 10, each of the internal clocks CLK1 and CLK2 may have a pulse width PW2. In addition, a delay DLY2 may be provided between the internal clock CLK1 and the internal clock CLK2.

Unlike the above assumption, in some cases, the bit DCO_CTR[3] of the oscillation control value DCO_CTR may have a value of logic "1" and other bits DCO_CTR[1], DCO_CTR[2], and DCO_CTR[4] to DCO_CTR[q] may have values of logic "0". In this case, unlike that illustrated in FIG. 9, the delay cells DC11 to DC16 may provide an internal oscillation loop in the sequence of the delay cells DC11, DC12, DC14, DC16, DC15, DC13, and DC11. As the internal oscillation loop gets longer, the pulse width PW2 and the delay DLY2 which are associated with the internal clocks CLK1 and CLK2 may get longer.

In addition, in some cases, the bit DCO_CTR[1] of the oscillation control value DCO_CTR may have a value of logic "1" and other bits DCO_CTR[2] to DCO_CTR[q] may have values of logic "0". In this case, unlike that illustrated in FIG. 9, the delay cells DC11 and DC12 may provide an internal oscillation loop in the sequence of the delay cells DC11, DC12, and DC11. As the internal oscillation loop gets shorter, the pulse width PW2 and the delay DLY2 which are associated with the internal clocks CLK1 and CLK2 may get shorter.

The logic gate LG14 of the delay cell DC11 may output the oscillation clock DCOCLK. The oscillation clock DCOCLK may be generated based on the internal clocks CLK1 and CLK2. The pulse width PW2 and the delay DLY2 which are associated with the internal clocks CLK1 and CLK2 may affect a frequency of the oscillation clock DCOCLK. That is, a frequency of the oscillation clock DCOCLK may be changed according to a length of an internal oscillation loop.

For example, the frequency of the oscillation clock DCOCLK may become lower as the internal oscillation loop gets longer. On the other hand, the frequency of the oscillation clock DCOCLK may become higher as the internal oscillation loop gets shorter. Accordingly, the frequency of the oscillation clock DCOCLK may be adjusted based on the oscillation control value DCO_CTR.

Figure 11:
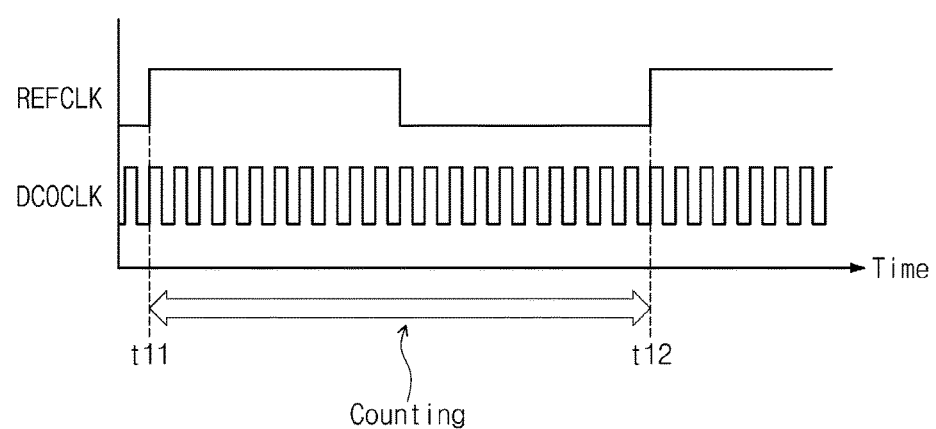
FIG. 11 is a timing diagram for describing an example operation of an auto-frequency controller of FIG. 8.

FIG. 11 is a timing diagram for describing an example operation of the auto-frequency controller of FIG. 8. To facilitate better understanding, FIG. 11 will be described together with FIG. 8.

In some example embodiments, the reference clock REFCLK may be provided from an external clock generator. The external clock generator may be included in the second electronic device 1200 of FIG. 1. For example, the reference clock REFCLK may be provided such that a frequency of the reference clock REFCLK is generally lower than a frequency of the oscillation clock DCOCLK.

The counter CNT may count the transitions of the oscillation clock DCOCLK to output the transition count C. For example, the counter CNT may count transitions of the oscillation clock DCOCLK during a reference period of the reference clock REFCLK (e.g., a time interval between time "t11" and time "t12").

For example, as illustrated in FIG. 11, between time "t11" and time "t12", the reference clock REFCLK may have a value of logic "1" and a value of logic "0". During one period of the reference clock REFCLK, the oscillation clock DCOCLK may transition from a state of logic "0" to a state of logic "1" twenty (20) times. In this example, the counter CNT may count transitions of the oscillation clock DCOCLK twenty times, and may output the transition count C corresponding to 20.

Figure 12:
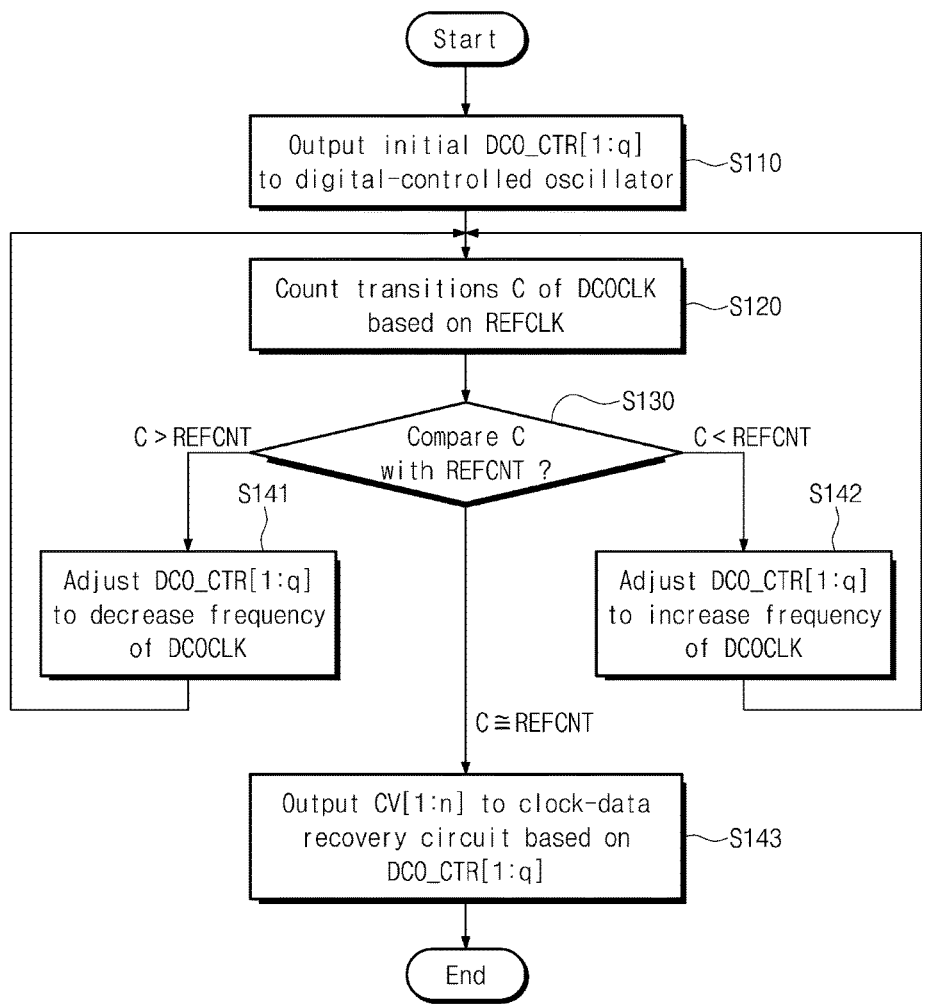
FIG. 12 is a flowchart describing an example operation of an auto-frequency controller of FIG. 8.

FIG. 12 is a flowchart describing an example operation of the auto-frequency controller of FIG. 8. To facilitate better understanding, FIG. 12 will be described together with FIG. 8.

In operation S110, the value controller 3220b may output an initial value of the oscillation control value DCO_CTR to the digital-controlled oscillator 3100b. For example, the initial value of the oscillation control value DCO_CTR may be stored in a memory element included in the second electronic device 1200 of FIG. 1. For example, the initial value of the oscillation control value DCO_CTR may be stored by a manufacturer and/or a user of the second electronic device 1200.

The digital-controlled oscillator 3100b may output the oscillation clock DCOCLK based on the oscillation control value DCO_CTR. Accordingly, in operation S120, the counter CNT may count transitions of the oscillation clock DCOCLK as described with reference to FIG. 11. The counter CNT may output the transition count C.

In operation S130, the comparator 3210b may compare the transition count C with the reference count REFCNT. The reference count REFCNT may indicate a value of the transition count C that is suitable for an intended communication condition. The reference count REFCNT that is associated with the intended communication condition may be obtained through an experiment, a test, a simulation, and/or the like. A value of the reference count REFCNT may be stored in a memory element included in the second electronic device 1200. For example, the value of the reference count REFCNT may be stored by a manufacturer and/or a user of the second electronic device 1200.

Electrical characteristics of electric lines and elements may be changed as a communication condition changes (e.g., PVT variation). For example, conductivity of electric lines and elements in a communication condition of low temperature may be smaller than conductivity of electric lines and elements in a communication condition of high temperature. Accordingly, for example, even though the digital-controlled oscillator 3100b receives the same oscillation control value DCO_CTR, a frequency of the oscillation clock DCOCLK may be changed according to the communication condition. For this reason, the transition count C may also be changed according to the communication condition, and may have a value that is unsuitable for the intended communication condition.

Accordingly, the comparator 3210b may compare the transition count C with the reference count REFCNT to determine whether the transition count C has a suitable value. The comparison result of the comparator 3210b may indicate (a) that the transition count C is larger than the reference count REFCNT, (b) that the transition count C is smaller than the reference count REFCNT, or (c) that the transition count C is the same as the reference count REFCNT or is within a reference range from the reference count REFCNT.

Due to a numerical error or an operation error, a transition count C within the reference range from the reference count REFCNT may be regarded identically to a transition count C being the same as the reference count REFCNT. The reference range may be selected appropriately in consideration of a numerical error or an operation error.

When the transition count C is larger than the reference count REFCNT, operation S141 may be performed. The transition count C that is larger than the reference count REFCNT may mean that a frequency of the oscillation clock DCOCLK is high. Accordingly, in operation S141, the value controller 3220b may adjust the oscillation control value DCO_CTR such that a frequency of the oscillation clock DCOCLK decreases (e.g., such that an internal oscillation loop gets longer). Afterwards, operations S120 and S130 may be repeated in regards to the adjusted oscillation control value DCO_CTR.

When the transition count C is smaller than the reference count REFCNT, operation S142 may be performed. The transition count C that is smaller than the reference count REFCNT may mean that a frequency of the oscillation clock DCOCLK is low. Accordingly, in operation S142, the value controller 3220b may adjust the oscillation control value DCO_CTR such that a frequency of the oscillation clock DCOCLK increases (e.g., such that an internal oscillation loop gets shorter). Afterwards, operations S120 and S130 may be repeated in regards to the adjusted oscillation control value DCO_CTR.

When the transition count C is the same as the reference count REFCNT or is within the reference range from the reference count REFCNT, operation S143 may be performed. The transition count C that is substantially the same as the reference count REFCNT may mean that a current setting is suitable for the intended communication condition. Accordingly, in operation S143, the value controller 3220b may generate the control value CV based on the current oscillation control value DCO_CTR. The generated control value CV may be provided to the clock-data recovery circuit 2000.

In some example embodiments, to generate the control value CV based on the oscillation control value DCO_CTR, the control value generation circuit 3000b may include mapping table information associated with a correspondence relationship between the oscillation control value DCO_CTR and the control value CV. The mapping table information may be obtained through an experiment, a test, a simulation, and/or the like. The value controller 3220b may output the control value CV corresponding to the current oscillation control value DCO_CTR with reference to the mapping table information.

In some example embodiments, the value controller 3220b may be configured to be similar to the divider 3200a of FIG. 6A. The value controller 3220b may convert the current oscillation control value DCO_CTR into a suitable control value CV.

In some example embodiments, the example operation of FIG. 12 may be performed while being involved in initialization processing after the second electronic device 1200 is booted up. Since the example operation of FIG. 12 may be performed without the reception signals S12, S23, and S31 of FIG. 2, the operation may be completed before communication between the transmission circuit 1111 and the reception circuit 1211 begins. In some example embodiments, the example operation of FIG. 12 may be performed periodically or when a specific condition is satisfied.

The control value generation circuit 3000b that uses a count value has been described with reference to FIGS. 8 to 12. However, the example embodiments are not limited thereto. In some example embodiments, the control value generation circuit 3000b may include a frequency analyzer. The control value generation circuit 3000b may be configured to compare a frequency of the oscillation clock DCOCLK with a reference frequency.

For example, when a frequency of the oscillation clock DCOCLK is higher than a reference frequency, the control value generation circuit 3000b may decrease a frequency of the oscillation clock DCOCLK. When a frequency of the oscillation clock DCOCLK is lower than the reference frequency, the control value generation circuit 3000b may increase a frequency of the oscillation clock DCOCLK. When a frequency of the oscillation clock DCOCLK is the same as the reference frequency or is within a reference range from the reference frequency, the control value generation circuit 3000b may output the control value CV based on a current frequency of the oscillation clock DCOCLK.

That is, the example embodiments are not limited to the configuration of FIG. 8. The configuration of the control value generation circuit 3000b may be variously changed or modified to output the control value CV that is suitable for the intended communication condition without the reception signals S12, S23, and S31. The control value CV may be changed depending on the communication condition.

The example configurations and operations of the control value generation circuit 3000 have been described with reference to FIGS. 6A to 12. Meanwhile, the control value generation circuit 3000 may not operate if re-configuration of the control value CV is not required. In some example embodiments, when the control value generation circuit 3000 does not operate, power supply to the control value generation circuit 3000 may be interrupted to reduce power consumption.

Figure 13:
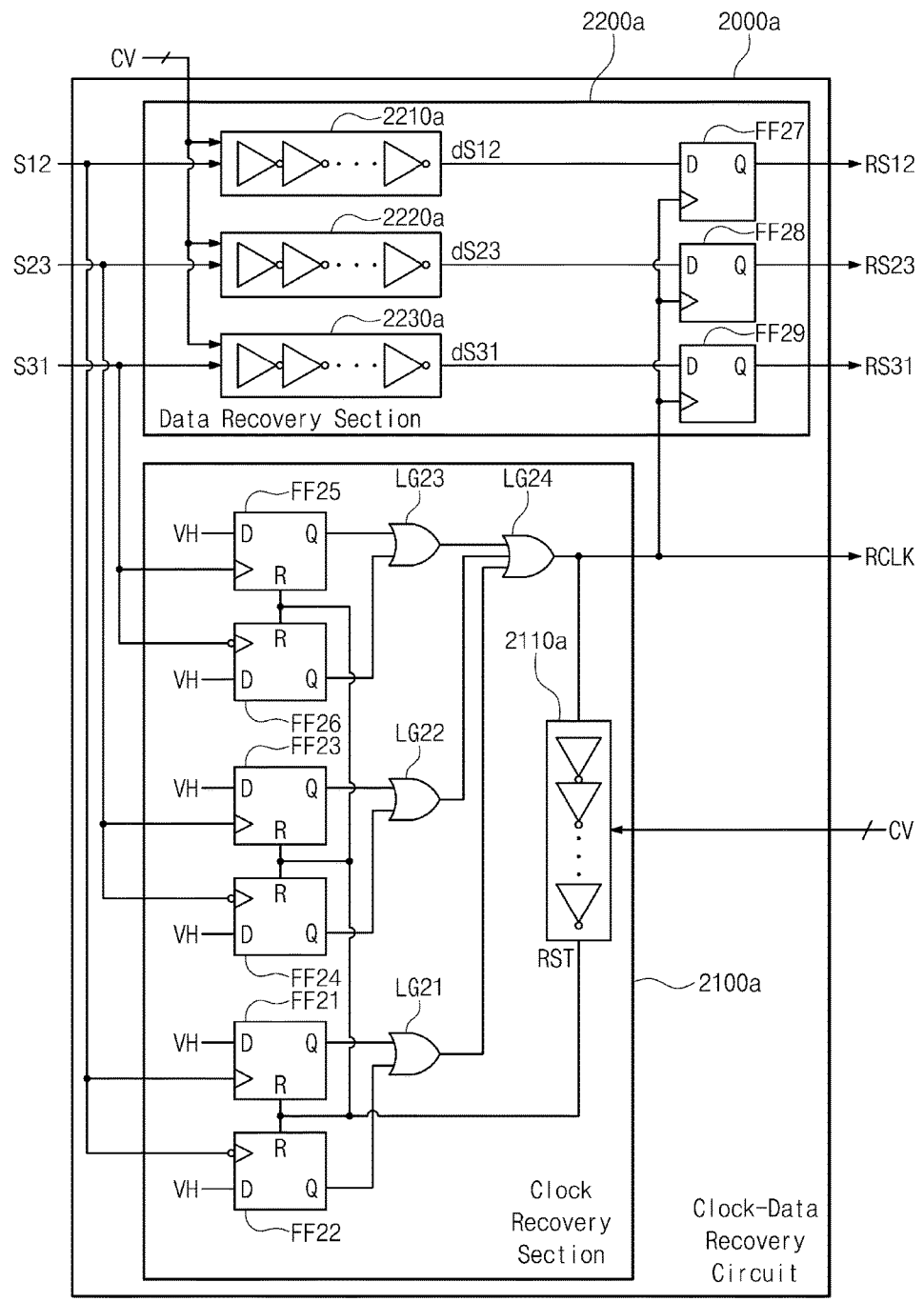
FIG. 13 is a block diagram illustrating an example configuration of a clock-data recovery circuit of FIG. 2.

FIG. 13 is a block diagram illustrating an example configuration of the clock-data recovery circuit of FIG. 2. In some example embodiments, the clock-data recovery circuit 2000 of FIG. 2 may include a clock-data recovery circuit 2000a of FIG. 13.

The clock-data recovery circuit 2000a may include a clock recovery section 2100a and a data recovery section 2200a. The clock recovery section 2100a may output the recovered clock RCLK, based on a transition generated in the reception signals S12, S23, and S31. The data recovery section 2200a may output the recovered signals RS12, RS23, and RS31, based on the recovered clock RCLK and the reception signals S12, S23, and S31.

In some example embodiments, the clock recovery section 2100a may include a delay circuit 2110a, and the data recovery section 2200a may include delay circuits 2210a, 2220a, and 2230a. Each of the delay circuits 2110a, 2210a, 2220a, and 2230a may correspond to the first plurality of delay cells DCs1 of FIG. 2.

Each of the delay circuits 2110a, 2210a, 2220a, and 2230a may receive the control value CV from the control value generation circuit 3000 of FIG. 2. A signal delay through each of the delay circuits 2110a, 2210a, 2220a, and 2230a may be adjusted based on the control value CV. Accordingly, even though a communication condition is changed (e.g., change in a data rate of the transmission signals S1, S2, and S3 and/or the reception signals S12, S23, and S31, PVT variation, and/or the like), the delay circuits 2110a, 2210a, 2220a, and 2230a may provide delays that are optimized for the communication condition.

In some example embodiments, the clock recovery section 2100a may include a logic circuit that generates a combination signal based on a transition generated in the reception signals S12, S23, and S31. For example, the logic circuit may include flip-flops FF21 to FF26 and logic gates LG21 to LG24.

The flip-flops FF21 and FF22 may output a logic value of the driving voltage VH (e.g., a value of logic "1") in response to a transition of the reception signal S12. The logic gate LG21 may combine outputs of the flip-flops FF21 and FF22. Accordingly, the logic gate LG21 may output a value of logic "1" when the reception signal S12 transitions.

The flip-flops FF23 and FF24 may output a logic value of the driving voltage VH (e.g., a value of logic "1") in response to a transition of the reception signal S23. The logic gate LG22 may combine outputs of the flip-flops FF23 and FF24. Accordingly, the logic gate LG22 may output a value of logic "1" when the reception signal S23 transitions.

The flip-flops FF25 and FF26 may output a logic value of the driving voltage VH (e.g., a value of logic "1") in response to a transition of the reception signal S31. The logic gate LG23 may combine outputs of the flip-flops FF25 and FF26. Accordingly, the logic gate LG23 may output a value of logic "1" when the reception signal S31 transitions.

The logic gate LG24 may combine outputs of the logic gates LG21, LG22, and LG23. Accordingly, the logic gate LG24 may output a value of logic "1" in response to a transition generated in the reception signals S12, S23, and S31. However, the logic gate LG24 may output a value of logic "1" in response to an initial transition of the reception signals S12, S23, and S31, and may not be affected by following transition(s) after the initial transition. Accordingly, the logic gate LG24 may provide the masking period between time "t1" and time "t3" described with reference to FIG. 4.

The logic gate LG24 may output a combination signal that is generated by the flip-flops FF21 to FF26 and the logic gates LG21 to LG24. The combination signal may be provided as the recovered clock RCLK. For example, a value of logic "1" of the combination signal output from the logic gate LG24 may provide the first edge (e.g., the rising edge) of the recovered clock RCLK.

The delay circuit 2110a may receive the combination signal (or the recovered clock RCLK) output from the logic gate LG24. The delay circuit 2110a may delay the received signal to output a reset signal RST. A delay of the delay circuit 2110a may be adjusted based on the control value CV. Accordingly, the combination signal (or the recovered clock RCLK) may be delayed through the delay circuit 2110a as much as a time length corresponding to the control value CV. Since the control value CV is changed depending on the communication condition, a delay of the delay circuit 2110a may also be adjusted according to change in the communication condition.

The flip-flops FF21 to FF26 may be reset in response to the reset signal RST. When the flip-flops FF21 to FF26 are reset, the logic gates LG21 to LG24 may output values of logic "0". A value of logic "0" of the combination signal output from the logic gate LG24 may provide the second edge (e.g., the falling edge) of the recovered clock RCLK. Accordingly, the recovered clock RCLK may have the second edge in response to the reset signal RST.

The data recovery section 2200a may delay the reception signals S12, S23, and S31 through the delay circuits 2210a, 2220a, and 2230a respectively. The delay circuits 2210a, 2220a, and 2230a may respectively delay the reception signals S12, S23, and S31 as much as a time length corresponding to the control value CV. Accordingly, the delay circuits 2210a, 2220a, and 2230a may respectively output delayed reception signals dS12, dS23, and dS31. As described with reference to FIG. 5, delaying the reception signals S12, S23, and S31 may provide suitable sampling timing.

The data recovery section 2200a may include a logic circuit that generates the recovered signals RS12, RS23, and RS31. For example, the logic circuit may include flip-flops FF27 to FF29. The flip-flops FF27 to FF29 may respectively receive the delayed reception signals dS12, dS23, and dS31. Each of the flip-flops FF27 to FF29 may receive the recovered clock RCLK from the clock recovery section 2100a.

Each of the flip-flops FF27 to FF29 may operate in response to the recovered clock RCLK (e.g., in response to the first edge of the recovered clock RCLK). For example, the flip-flops FF27 to FF29 may respectively sample the delayed reception signals dS12, dS23, and dS31 in response to the recovered clock RCLK. The flip-flops FF27 to FF29 may respectively output the recovered signals RS12, RS23, and RS31 as sampling results.

In the clock-data recovery circuit 2000a, a recovered clock may include a single recovered clock RCLK. The flip-flops FF27 to FF29 may operate in response to the single recovered clock RCLK. Accordingly, the recovered signals RS12, RS23, and RS31 may be output in response to the single recovered clock RCLK in common.

Figure 14:
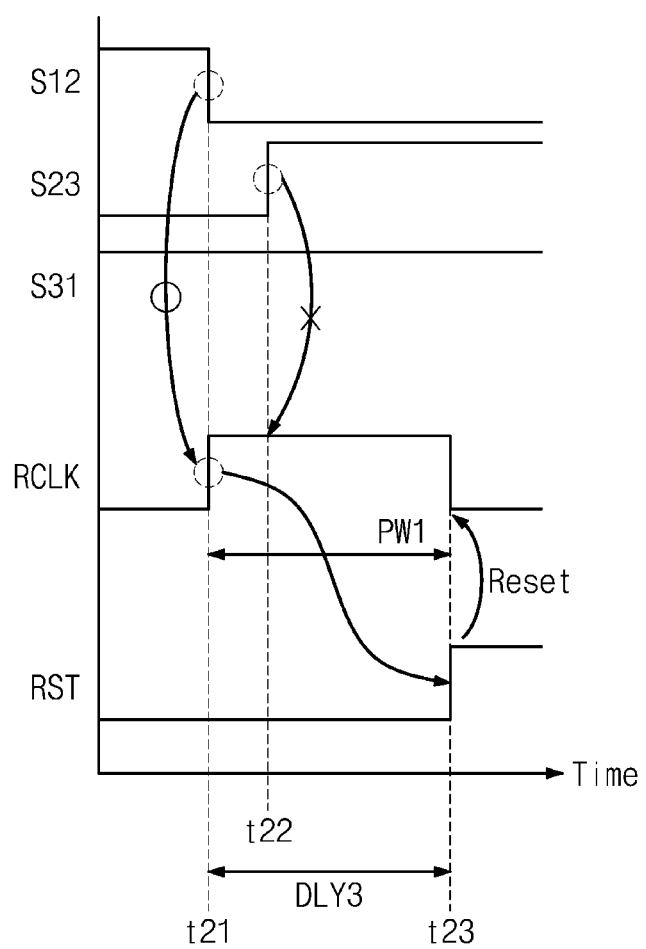
FIG. 14 is a timing diagram for describing an example operation of a clock-data recovery circuit of FIG. 13.

FIG. 14 is a timing diagram for describing an example operation of the clock-data recovery circuit of FIG. 13. To facilitate better understanding, FIG. 14 will be described together with FIG. 13.

At time "t21", an initial transition may be generated in the reception signal S12. Accordingly, the flip-flops FF21 and FF22 and the logic gates LG21 and LG24 of the clock recovery section 2100a may provide the first edge of the recovered clock RCLK at time "t21".

Meanwhile, at time "t22", a following transition may be generated in the reception signal S23. However, as the logic gate LG24 is provided, the following transition of the reception signal S23 may be masked without affecting the recovered clock RCLK.

The delay circuit 2110a may delay the combination signal (or the recovered clock RCLK) output from the logic gate LG24 as much as a delay DLY3. The delay DLY3 may be determined based on the control value CV. The delay circuit 2110a may delay the combination signal (or the recovered clock RCLK) to output the reset signal RST.

At time "t23", the recovered clock RCLK may be reset in response to the reset signal RST. Accordingly, the reset signal RST may provide the second edge of the recovered clock RCLK at time "t23". The recovered clock RCLK may have the pulse width PW1. The pulse width PW1 may correspond to the delay DLY3 between the recovered clock RCLK and the reset signal RST.

During the delay DLY3 between time "t21" and time "t23", following transition(s) after the initial transition of the reception signals S12, S23, and S31 may be masked. Accordingly, the delay DLY3 may be associated with a length of the masking period. After the recovered clock RCLK is reset, an initial transition that is generated in a next symbol period may affect the recovered clock RCLK. To this end, each of the delay DLY3 and the pulse width PW1 may be shorter than a length of one symbol period.

The reset timing of the recovered clock RCLK may be significant to provide an appropriate waveform of the recovered clock RCLK. When the communication condition is changed (e.g., change in a data rate of the transmission signals S1, S2, and S3 and/or the reception signals S12, S23, and S31, PVT variation, and/or the like), it may be required to adjust the reset timing of the recovered clock RCLK to be suitable for the changed communication condition. In the example embodiments, the control value CV may provide the reset timing that is optimized for the communication condition.

Figure 15:
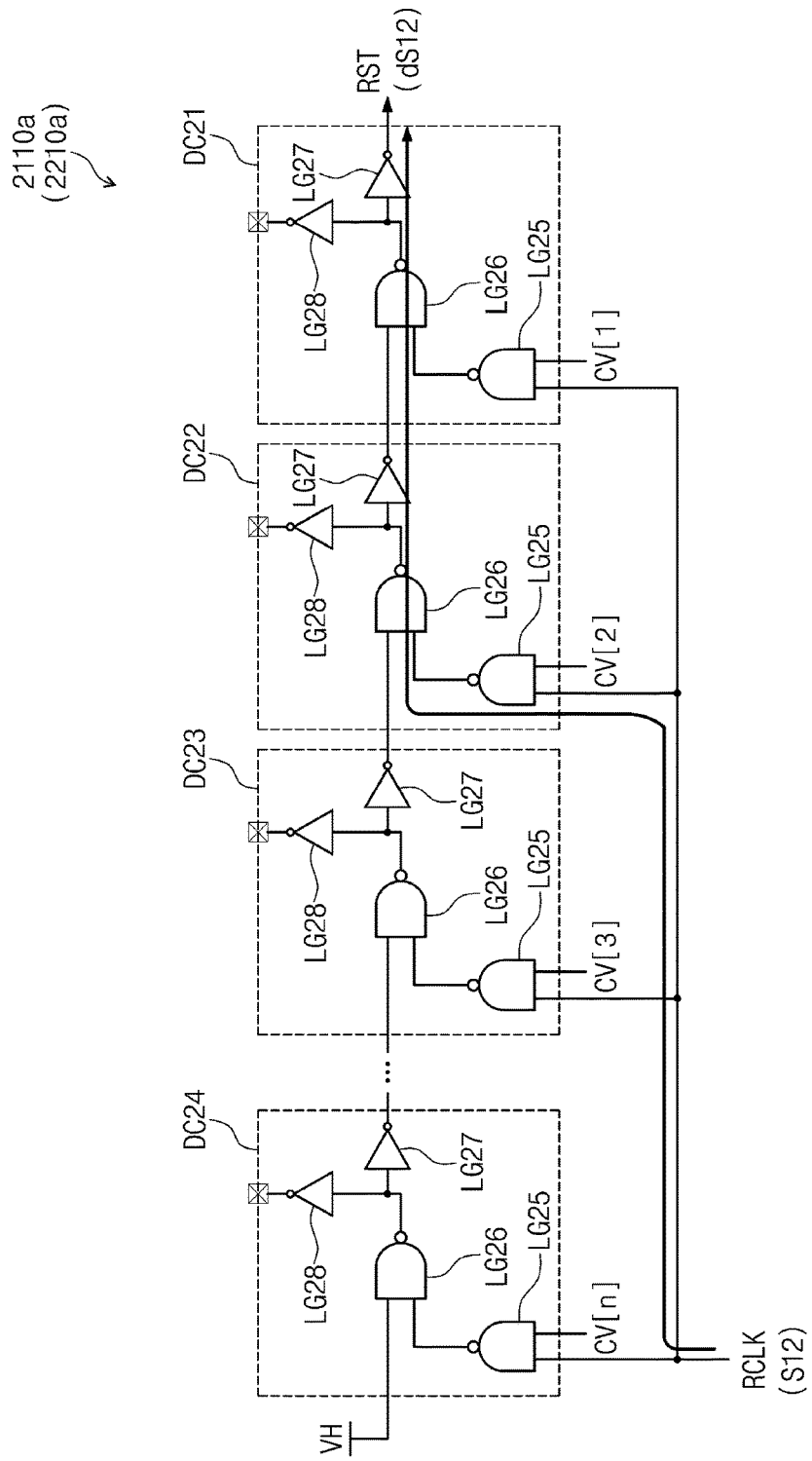
FIG. 15 is a block diagram illustrating an example configuration of a delay circuit of FIG. 13.

FIG. 15 is a block diagram illustrating an example configuration of a delay circuit of FIG. 13. To facilitate better understanding, FIG. 15 will be described together with FIG. 13.

For example, the delay circuit 2110a of the clock recovery section 2100a may include delay cells DC21 to DC24. The delay cells DC21 to DC24 may correspond to the first plurality of delay cells DCs1 of FIG. 2. The delay circuit 2110a may delay the recovered clock RCLK through the delay cells DC21 to DC24 to output the reset signal RST.

For example, each of the delay cells DC21 to DC24 may include logic gates LG25 to LG28, but configurations of the delay cells DC21 to DC24 may be variously changed or modified to delay a signal. In each delay cell, the connection between the logic gates LG25 to LG28 may be similar to the connection between the logic gates LG2 to LG5 described with reference to FIG. 6B, thus detailed descriptions thereof will be omitted below for brevity.

As understood with reference to FIGS. 6B, 9, and 15, each delay cell of the second plurality of delay cells DCs2 may be configured to be substantially the same as or similar to each delay cell of the first plurality of delay cells DCs1. The reason is because, if each delay cell of the second plurality of delay cells DCs2 is configured to be different from each delay cell of the first plurality of delay cells DCs1, the influence of the communication condition on each delay cell of the second plurality of delay cells DCs2 may become different from the influence of the communication condition on each delay cell of the first plurality of delay cells DCs1. To generate the suitable control value CV, delay cells may include the same or similar configurations/connection.

The delay cells DC21, DC22, DC23, and D24 may be respectively activated or deactivated by bits CV[1], CV[2], CV[3], and CV[n] of the control value CV. Accordingly, the delay cells DC21, DC22, DC23, and D24 may delay or may not delay the recovered clock RCLK in response to bits CV[1], CV[2], CV[3], and CV[n] of the control value CV respectively.

As an example to facilitate better understanding, the bit CV[2] of the control value CV may have a value of logic "1" and other bits CV[1] and CV[3] to CV[n] may have values of logic "0". In this example, the delay cells DC21 and DC22 may be activated to delay the recovered clock RCLK. However, other delay cells DC23 and DC24 may be deactivated and may not be included in a delay path.

Unlike the above example, in some cases, the bit CV[3] of the control value CV may have a value of logic "1" and other bits CV[1], CV[2], and CV[4] to CV[n] may have values of logic "0". In this case, unlike that illustrated in FIG. 15, the delay cells DC21, DC22, and DC23 may be activated to delay the recovered clock RCLK, and other delay cell DC24 may be deactivated.

In addition, in some cases, the bit CV[1] of the control value CV may have a value of logic "1", and other bits CV[2] to CV[n] may have values of logic "0". In this case, unlike that illustrated in FIG. 15, the delay cell DC21 may be activated to delay the recovered clock RCLK, and other delay cells DC22, DC23, and DC24 may be deactivated.

A delay of the delay circuit 2110a may be variable according to the number of activated delay cells. As the number of activated delay cells increases, a delay of the delay circuit 2110a may get longer. As the number of activated delay cells decreases, a delay of the delay circuit 2110a may get shorter.

The number of activated delay cells may be adjusted based on the control value CV. Accordingly, a delay of the delay circuit 2110a may be adjusted based on the control value CV, and the delay circuit 2110a may delay the recovered clock RCLK as much as a time length corresponding to the control value CV.

Each of the delay circuits 2210a, 2220a, and 2230a of the data recovery section 2200a may be configured substantially the same as the delay circuit 2110a of FIG. 15. For example, the delay circuit 2210a may delay the reception signal S12 through the delay cells DC21 to DC24 to output the delayed reception signal dS12. Detailed descriptions of the delay circuits 2210a, 2220a, and 2230a will be omitted below for brevity. In addition, delay circuits that will be described below may also be configured substantially the same as the delay circuit 2110a of FIG. 15.

Figure 16:
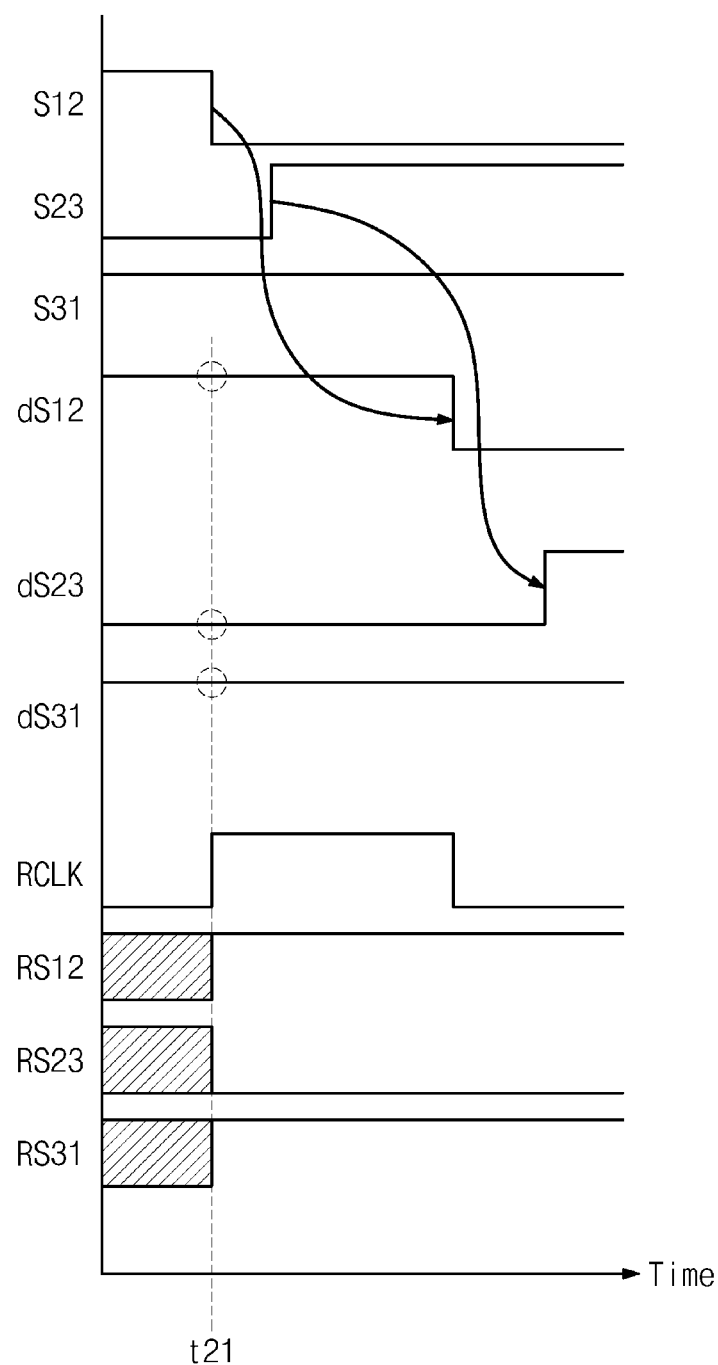
FIG. 16 is a timing diagram for describing an example operation of a clock-data recovery circuit of FIG. 13.

FIG. 16 is a timing diagram for describing an example operation of the clock-data recovery circuit of FIG. 13. To facilitate better understanding, FIG. 16 will be described together with FIG. 13. In FIG. 16, slashed areas may mean that the recovered signals RS12, RS23, and RS31 may have any logic values.

The recovered clock RCLK may have the first edge in response to transition of the reception signal S12 at time "t21". Meanwhile, a timing of the first edge of the recovered clock RCLK may not be suitable to sample the reception signal S12. Accordingly, the delay circuits 2210a, 2220a, and 2230a may delay the reception signals S12, S23, and S31 to output the delayed reception signals dS12, dS23, and dS31 respectively. The delay circuits 2210a, 2220a, and 2230a may respectively delay the reception signals S12, S23, and S31 as much as a time length corresponding to the control value CV.

At time "t21", the flip-flops FF27 to FF29 may sample the delayed reception signals dS12, dS23, and dS31 appropriately in response to the first edge of the recovered clock RCLK. The flip-flops FF27 to FF29 may output the sampled signals as the recovered signals RS12, RS23, and RS31 respectively.

A sampling timing of the reception signals S12, S23, and S31 may be significant to output the appropriate recovered signals RS12, RS23, and RS13. When the communication condition is changed (e.g., change in a data rate of the transmission signals S1, S2, and S3 and/or the reception signals S12, S23, and S31, PVT variation, and/or the like), it may be required to adjust the sampling timing of the reception signals S12, S23, and S31 to be suitable for the changed communication condition. In the example embodiments, the control value CV may provide the sampling timing (e.g., a setup/hold period) that is optimized for the communication condition.

Figure 17:
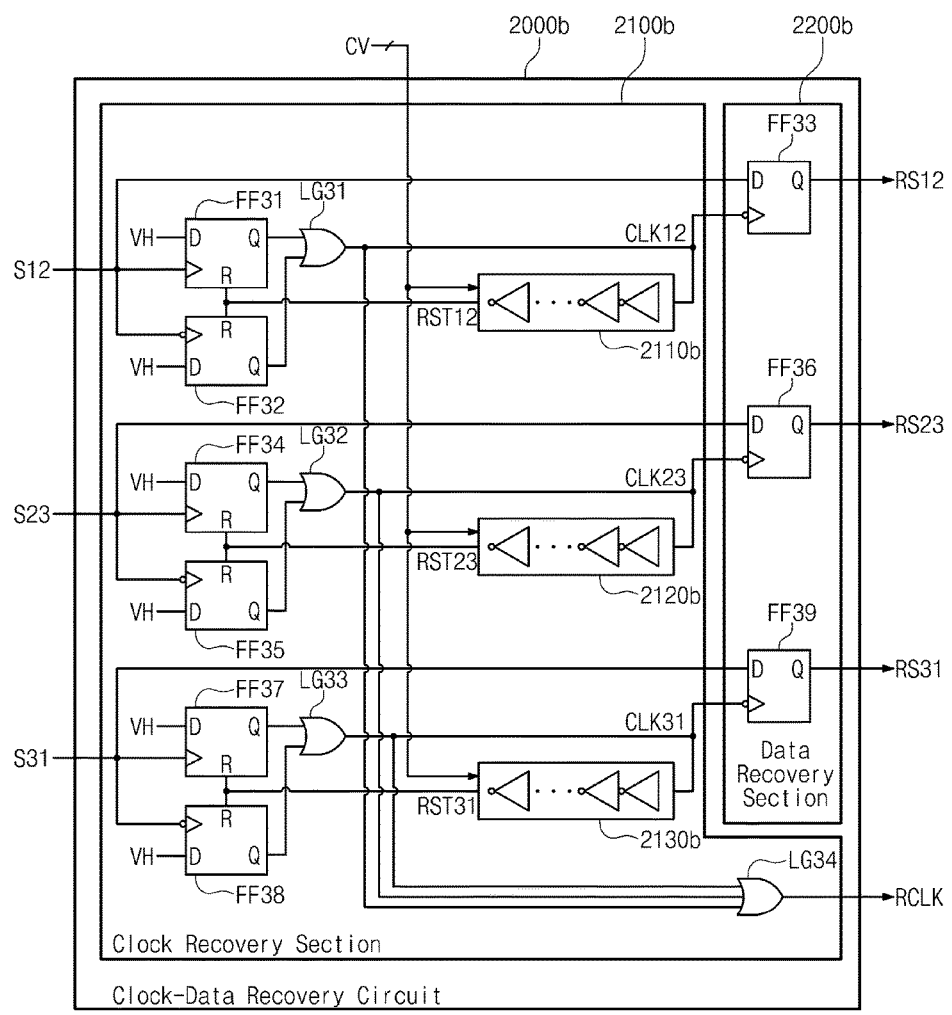
FIG. 17 is a block diagram illustrating an example configuration of a clock-data recovery circuit of FIG. 2.

FIG. 17 is a block diagram illustrating an example configuration of the clock-data recovery circuit of FIG. 2. In some example embodiments, the clock-data recovery circuit 2000 of FIG. 2 may include a clock-data recovery circuit 2000b of FIG. 17.

The clock-data recovery circuit 2000b may include a clock recovery section 2100b and a data recovery section 2200b. The clock recovery section 2100b may generate recovered clocks CLK12, CLK23, and CLK31 based on a transition generated in the reception signals S12, S23, and S31 respectively, and may output the recovered clock RCLK based on the recovered clocks CLK12, CLK23, and CLK31. The data recovery section 2200b may output the recovered signals RS12, RS23, and RS31 based on the recovered clocks CLK12, CLK23, and CLK31 and the reception signals S12, S23, and S31.

In some example embodiments, the clock recovery section 2100b may include delay circuits 2110b, 2120b, and 2130b. Each of the delay cells 2110b, 2120b, and 2130b may correspond to the first plurality of delay cells DCs1 of FIG. 2.

Each of the delay circuits 2110b, 2120b, and 2130b may receive the control value CV from the control value generation circuit 3000 of FIG. 2. A signal delay through each of the delay circuits 2110b, 2120b, and 2130b may be adjusted based on the control value CV. Accordingly, even though a communication condition is changed (e.g., change in a data rate of the transmission signals S1, S2, and S3 and/or the reception signals S12, S23, and S31, PVT variation, and/or the like), each of the delay circuits 2110b, 2120b, and 2130b may provide a delay that is optimized for the changed communication condition.

In some example embodiments, the clock recovery section 2100b may include a logic circuit that generates a combination signal based on a transition generated in reception signals S12, S23, and S31. For example, the logic circuit may include flip-flops FF31, FF32, FF34, FF35, FF37, and FF38 and logic gates LG31 to LG34.

The flip-flops FF31 and FF32 may output a logic value of the driving voltage VH (e.g., a value of logic "1") in response to transition of the reception signal S12. The logic gate LG31 may combine outputs of the flip-flops FF31 and FF32. Accordingly, the logic gate LG31 may output a value of logic "1" when the reception signal S12 transitions.

The logic gate LG31 may output a combination signal that is generated by the flip-flops FF31 and FF32 and the logic gate LG31. The combination signal may be provided as the recovered clock CLK12. For example, a value of logic "1" of the combination signal output from the logic gate LG31 may provide the first edge (e.g., the rising edge) of the recovered clock CLK12.

The delay circuit 2110b may receive the combination signal (or the recovered clock CLK12) output from the logic gate LG31. The delay circuit 2110b may delay the received signal to output a reset signal RST12. A delay of the delay circuit 2110b may be adjusted based on the control value CV. Accordingly, the combination signal (or the recovered clock CLK12) may be delayed through the delay circuit 2110b as much as a time length corresponding to the control value CV. Since the control value CV is changed depending on the communication condition, a delay of the delay circuit 2110b may also be adjusted according to change in the communication condition.

The flip-flops FF31 and FF32 may be reset in response to the reset signal RST12. When the flip-flops FF31 and FF32 are reset, the logic gate LG31 may output a value of logic "0". A value of logic "0" of the combination signal output from the logic gate LG31 may provide the second edge (e.g., the falling edge) of the recovered clock CLK12. Accordingly, the recovered clock CLK12 may have the second edge in response to the reset signal RST12.

Similarly, the flip-flops FF34 and FF35 and the logic gate LG32 may output a value of logic "1" in response to transition of the reception signal S23. Output of the logic gate LG32 may be provided as the recovered clock CLK23. The delay circuit 2120b may delay the output of the logic gate LG32 to output a reset signal RST23. The flip-flops FF34 and FF35 and the logic gate LG32 may output a value of logic "0" in response to the reset signal RST23. Accordingly, the recovered clock CLK23 may have the first edge in response to transition of the reception signal S23, and may have the second edge in response to the reset signal RST23.

In addition, the flip-flops FF37 and FF38 and the logic gate LG33 may output a value of logic "1" in response to transition of the reception signal S31. Output of the logic gate LG33 may be provided as the recovered clock CLK31. The delay circuit 2130b may delay the output of the logic gate LG33 to output a reset signal RST31. The flip-flops FF37 and FF38 and the logic gate LG33 may output a value of logic "0" in response to the reset signal RST31. Accordingly, the recovered clock CLK31 may have the first edge in response to transition of the reception signal S31, and may have the second edge in response to the reset signal RST31.

The logic gate LG34 may combine outputs of the logic gates LG31, LG32, and LG33 to output the recovered clock RCLK. The logic gate LG34 may output a value of logic "1" in response to a transition generated in the reception signals S12, S23, and S31. However, the logic gate LG34 may output a value of logic "1" in response to an initial transition of the reception signals S12, S23, and S31, and may not be affected by following transition(s) after the initial transition. Accordingly, the logic gate LG34 may allow providing the masking period.

The logic gate LG34 may output a value of logic "0" when all the flip-flops FF31, FF32, FF34, FF35, FF37, and FF38 are reset. Accordingly, the recovered clock RCLK may have the first edge in response to the initial transition of the reception signals S12, S23, and S31, and may have the second edge in response to the reset signals RST12, RST23, and RST31.

The data recovery section 2200b may include a logic circuit that generates the recovered signals RS12, RS23, and RS31. For example, the logic circuit may include flip-flops FF33, FF36, and FF39. The flip-flops FF33, FF36, and FF39 may respectively receive the reception signals S12, S23, and S31. The flip-flops FF33, FF36, and FF39 may respectively receive the recovered clocks CLK12, CLK23, and CLK31 from the clock recovery section 2100b.

The flip-flop FF33 may operate in response to the recovered clock CLK12 (e.g., in response to the second edge of the recovered clock CLK12). For example, the flip-flop FF33 may sample the reception signal S12 in response to the recovered clock CLK12. The flip-flop F33 may output the recovered signal RS12 as a sampling result.

Similarly, the flip-flop FF36 may sample the reception signal S23 in response to the second edge of the recovered clock CLK23, thus may output the recovered signal RS23. In addition, the flip-flop FF39 may sample the reception signal S31 in response to the second edge of the recovered clock CLK31, and thus may output the recovered signal RS31.

In the clock-data recovery circuit 2000b, a recovered clock may include a plurality of recovered clocks CLK12, CLK23, CLK31, and RCLK. The recovered clocks CLK12, CLK23, and CLK31 may be generated separately based respectively on transitions of the reception signals S12, S23, and S31. The recovered clock RCLK may be output to the outside of the reception circuit 1211 of FIG. 2 based on the recovered clocks CLK12, CLK23, and CLK31.

The flip-flops FF33, FF36, and FF39 may independently operate in response to the recovered clocks CLK12, CLK23, and CLK31 respectively. Accordingly, each of the recovered signals RS12, RS23, and RS31 may be output in response independently to a recovered clock, which is associated with a respective one of the reception signals S12, S23, and S31, from among the recovered clocks CLK12, CLK23, and CLK31.

Figure 18:
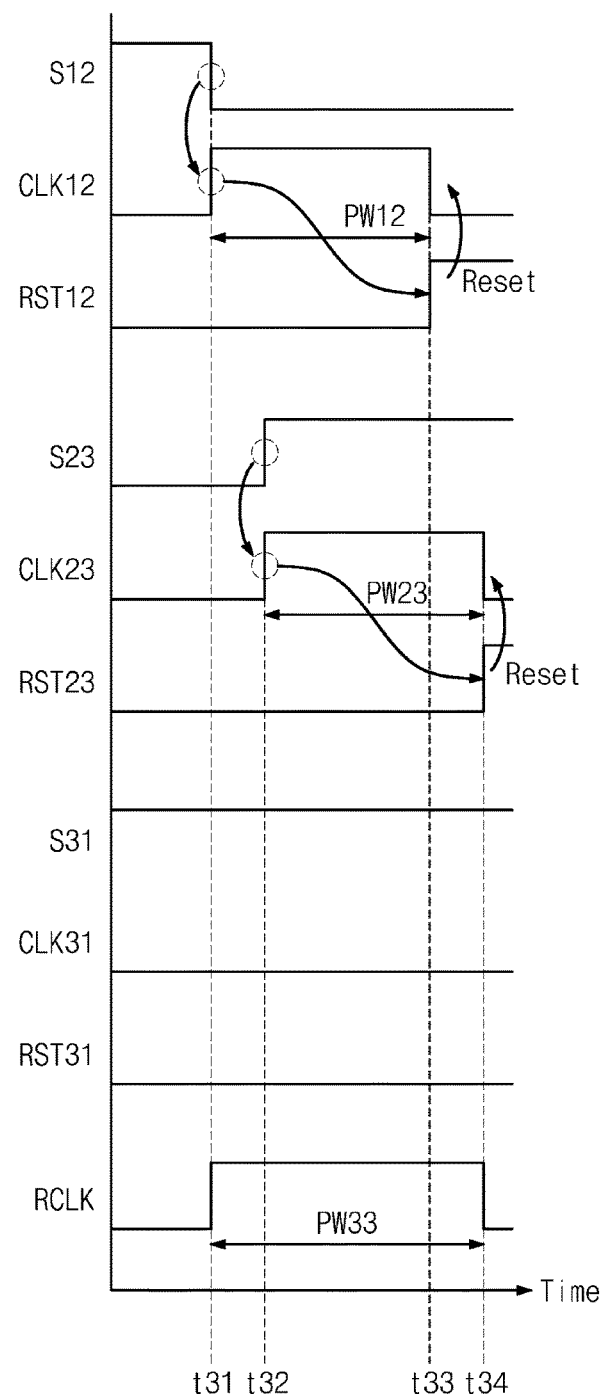
FIGS. 18 and 19 are timing diagrams for describing an example operation of a clock-data recovery circuit of FIG. 17.

FIG. 18 is a timing diagram for describing an example operation of the clock-data recovery circuit of FIG. 17. To facilitate better understanding, FIG. 18 will be described together with FIG. 17.

At time "t31", the reception signal S12 may transition. Accordingly, the flip-flops FF31 and FF32 and the logic gate LG31 of the clock recovery section 2100*b* may provide the first edge of the recovered clock CLK12 at time "t31". At time "t32", the reception signal S23 may transition. Accordingly, the flip-flops FF34 and FF35 and the logic gate LG32 of the clock recovery section 2100*b* may provide the first edge of the recovered clock CLK23 at time "t32".

The delay circuit 2110*b* may delay a combination signal (or the recovered clock CLK12) output from the logic gate LG31, and then may output the reset signal RST12. At time "t33", the recovered clock CLK12 may be reset in response to the reset signal RST12. Accordingly, the reset signal RST12 may provide the second edge of the recovered clock CLK12 at time "t33". The recovered clock CLK12 may have the pulse width PW12.

The delay circuit 2120*b* may delay a combination signal (or the recovered clock CLK23) output from the logic gate LG32, and then may output the reset signal RST23. At time "t34", the recovered clock CLK23 may be reset in response to the reset signal RST23. Accordingly, the reset signal RST23 may provide the second edge of the recovered clock CLK23 at time "t34". The recovered clock CLK23 may have the pulse width PW23.

The pulse width PW12 and the pulse width PW23 may be determined based on the control value CV. Meanwhile, the reception signal S31 may not transition, and the recovered clock CLK31 may not have any edge. The reset signal RST31 may have a constant logic value in response to the recovered clock CLK31.

The logic gate LG34 may combine the recovered clock CLK12, CLK23, and CLK31 to output the recovered clock RCLK. The recovered clock RCLK may have the first edge in response to transition of the reception signal S12 at time "t31", and may have the second edge in response to the reset signal RST23 at time "t34". The recovered clock RCLK may have a pulse width PW33. As the logic gate LG34 is provided, transition of the reception signal S23 may be masked without affecting the recovered clock RCLK.

Figure 19:
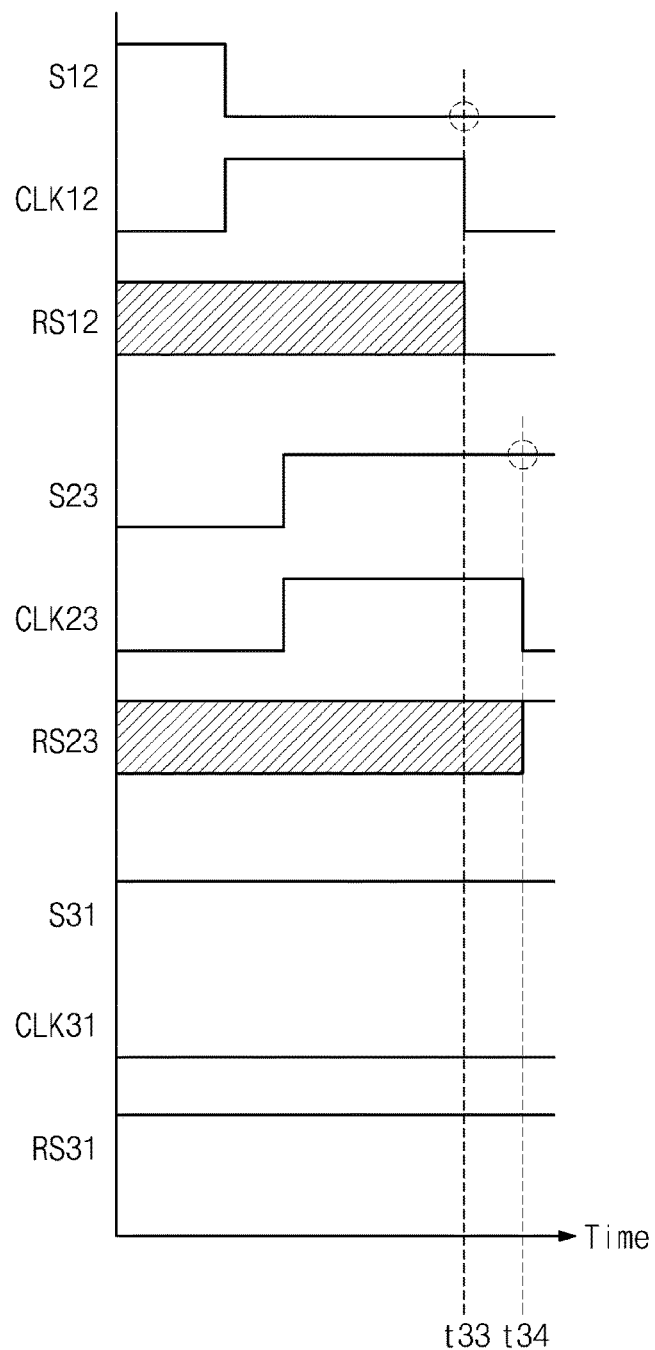

FIG. 19 is a timing diagram for describing an example operation of the clock-data recovery circuit of FIG. 17. To facilitate better understanding, FIG. 19 will be described together with FIG. 17. In FIG. 19, slashed areas may mean that the recovered signals RS12 and RS23 may have any logic values.

To provide a sampling timing which is suitable to sample the reception signals S12, S23, and S31, the clock-data recovery circuit 2000*b* may use the second edge (e.g., the falling edge) of each of the recovered clocks CLK12, CLK23, and CLK31.

At time "t33", the flip-flop FF33 may sample the reception signal S12 appropriately in response to the second edge of the recovered clock CLK12. The flip-flop F33 may output the sampled signal as the recovered signal RS12. Similarly, at time "t34", the flip-flop FF36 may sample the reception signal S23 appropriately in response to the second edge of the recovered clock CLK23. The flip-flop FF36 may output the sampled signal as the recovered signal RS23.

Meanwhile, the recovered clock CLK31 may not transition. The reason is because the reception signal S31 remains at a previous logic value without transition. Accordingly, the recovered signal RS31 may also remain a previous logic value.

Figure 20:
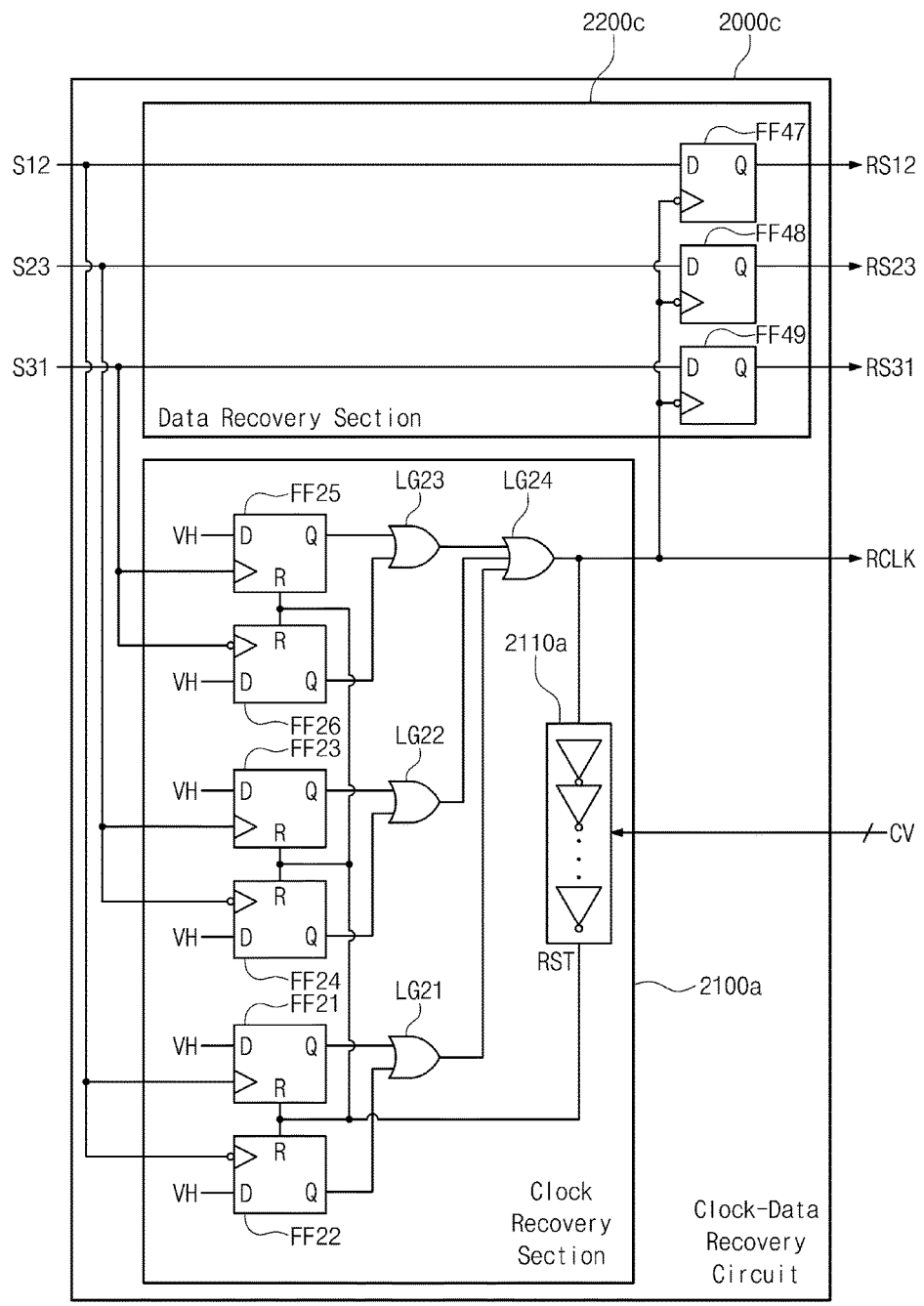
FIG. 20 is a block diagram illustrating an example configuration of a clock-data recovery circuit of FIG. 2.
Figure 21:
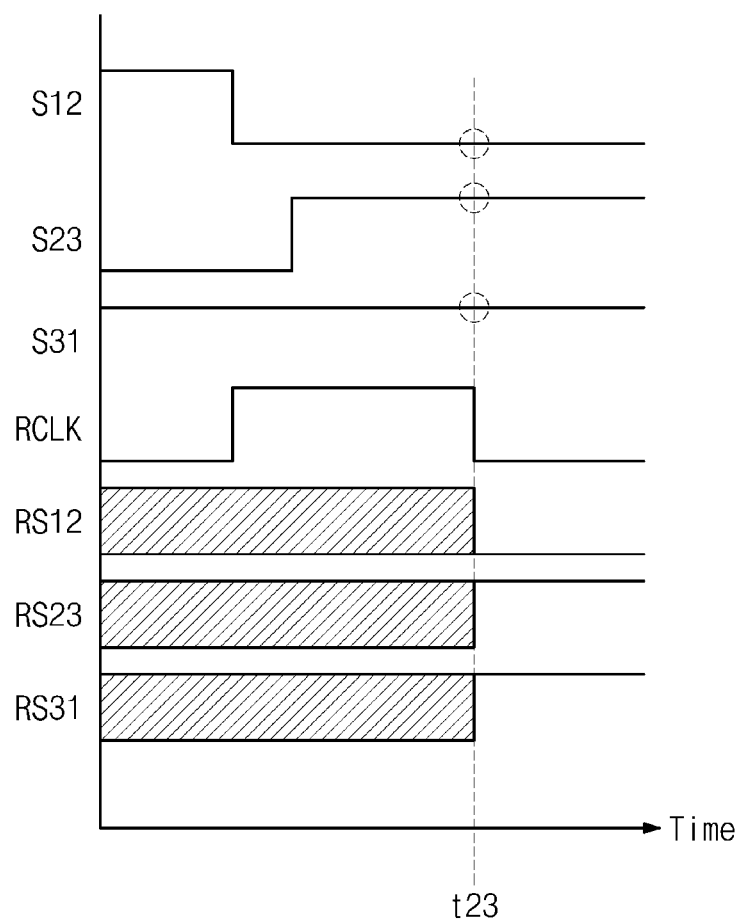
FIG. 21 is a timing diagram for describing an example operation of a clock-data recovery circuit of FIG. 20.

FIG. 20 is a block diagram illustrating an example configuration of the clock-data recovery circuit of FIG. 2. FIG. 21 is a timing diagram for describing an example operation of the clock-data recovery circuit of FIG. 20. To facilitate better understanding, FIG. 21 will be described together with FIG. 20. In some example embodiments, the clock-data recovery circuit 2000 of FIG. 2 may include a clock-data recovery circuit 2000*c* of FIG. 20.

Referring to FIG. 20, the clock-data recovery circuit 2000*c* may include the clock recovery section 2100*a* and a data recovery section 2200*c*. The clock recovery section 2100*a* may be configured and may operate as described with reference to FIGS. 13 to 16. For brevity, redundant descriptions of the clock recovery section 2100*a* will be omitted below.

The data recovery section 2200*c* may output the recovered signals RS12, RS23, and RS31 based on the recovered clock RCLK and the reception signals S12, S23, and S31. Unlike the data recovery section 2200*a* of FIG. 13, the data recovery section 2200*c* may not include a delay circuit and a delay cell. The data recovery section 2200*c* may include a logic circuit that generates the recovered signals RS12, RS23, and RS31.

For example, the logic circuit may include flip-flops FF47 to FF49. The flip-flops FF47 to FF49 may respectively receive the reception signals S12, S23, and S31. Each of the flip-flops FF47 to FF49 may receive the recovered clock RCLK from the clock recovery section 2100*a*. Each of the flip-flops FF47 to FF49 may operate in response to the recovered clock RCLK (e.g., in response to the second edge of the recovered clock RCLK).

Referring to FIGS. 20 and 21, at time "t23", the flip-flops FF47 to FF49 may respectively sample the reception signals S12, S23, and S31 in response to the second edge of the recovered clock RCLK. The flip-flops FF47 to FF49 may respectively output the recovered signals RS12, RS23, and RS31 as sampling results. In FIG. 21, slashed areas may mean that the recovered signals RS12, RS23, and RS31 may have any logic values.

Figure 22:
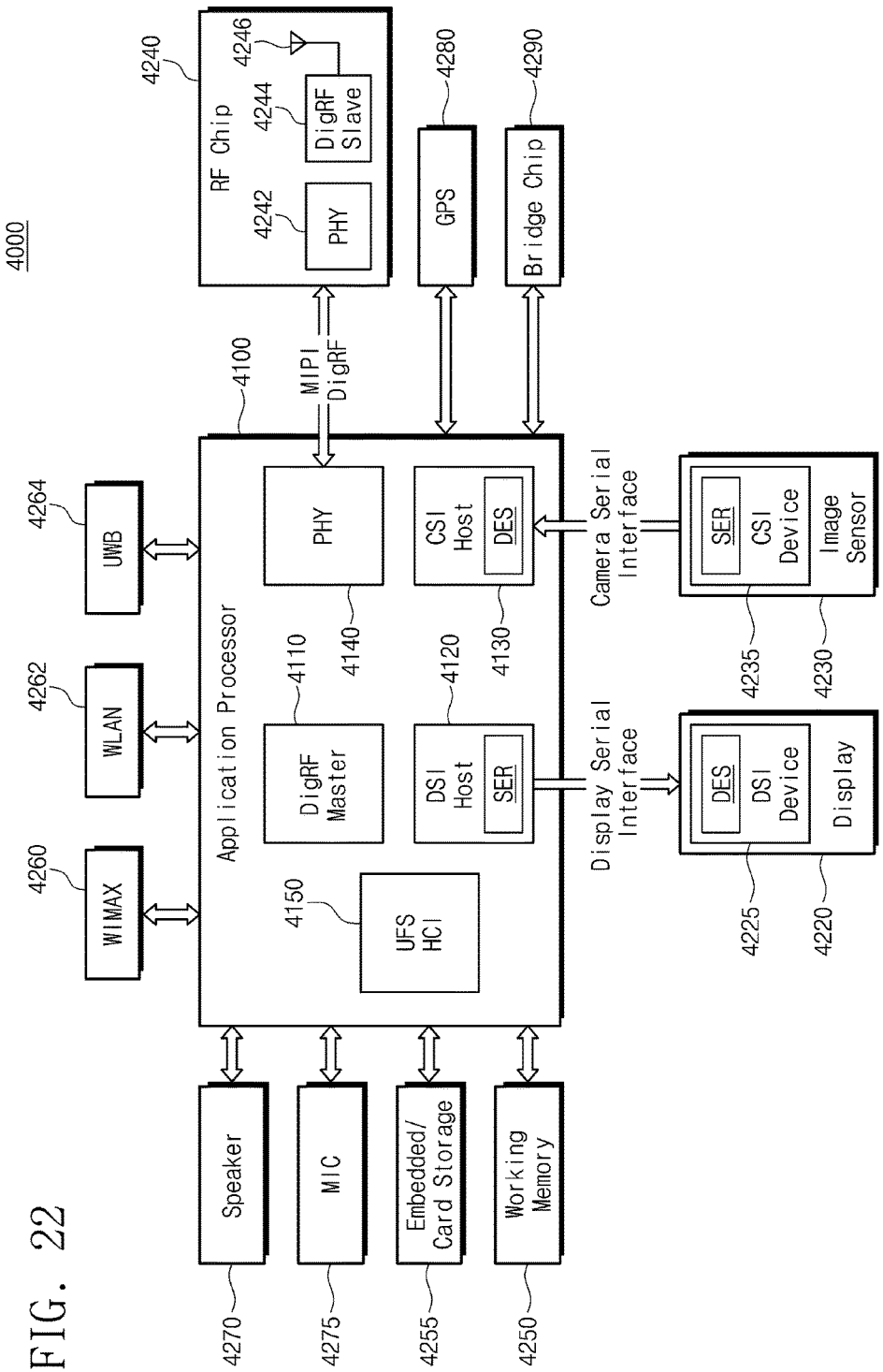
FIG. 22 is a block diagram illustrating an example configuration of an electronic device that employs an electronic circuit according to the example embodiments and interfaces thereof.

FIG. 22 is a block diagram illustrating an example configuration of an electronic device that employs an electronic circuit according to the example embodiments and interfaces thereof.

An electronic device 4000 may be implemented in a data processing device that uses or supports an interface protocol proposed by the MIPI alliance. For example, the electronic device 4000 may be one of electronic devices such as a portable communication terminal, a personal digital assistant (PDA), a portable media player (PMP), a smart phone, a tablet computer, a wearable device, and/or the like.

The electronic device 4000 may include an application processor 4100, a display 4220, and an image sensor 4230. The application processor 4100 may include a DigRF master 4110, a display serial interface (DSI) host 4120, a camera serial interface (CSI) host 4130, a physical layer 4140, and an UFS host-controller interface (HCI) 4150.

The DSI host 4120 may communicate with a DSI device 4225 of the display 4220 in compliance with the DSI. For example, a serializer SER may be implemented in the DSI host 4120, and a deserializer DES may be implemented in the DSI device 4225. For example, the DSI may employ a physical layer that is defined in the C-PHY specification, and the DSI host 4120 may communicate with the DSI device 4225 through three or more communication lines. In some example embodiments, the DSI host 4120 and/or the DSI device 4225 may include a reception circuit that adjusts a delay depending on a communication condition.

The CSI host 4130 may communicate with a CSI device 4235 of the image sensor 4230 in compliance with the CSI. For example, a deserializer DES may be implemented in the CSI host 4130, and a serializer SER may be implemented in the CSI device 4235. For example, the CSI may employ a physical layer that is defined in the C-PHY specification, and the CSI host 4130 may communicate with the CSI device 4235 through three or more communication lines. In some example embodiments, the CSI host 4130 and/or the CSI device 4235 may include a reception circuit that adjusts a delay depending on a communication condition.

The electronic device 4000 may further include a radio frequency (RF) chip 4240 that communicates with the application processor 4100. The RF chip 4240 may include a physical layer 4242, a DigRF slave 4244, and an antenna 4246. For example, the physical layer 4242 of the RF chip 4240 and the physical layer 4140 of the application processor 4100 may exchange data with each other in compliance with a DigRF interface proposed by the MIPI alliance. In some example embodiments, when the physical layers 4242 and 4140 communicate with each other through three or more communication lines, the physical layer 4242 and/or the physical layer 4140 may include a reception circuit that adjusts a delay depending on a communication condition.

The electronic device 4000 may further include a working memory 4250 and an embedded/card storage device 4255. The working memory 4250 may temporarily store data processed or to be processed by the application processor 4100. The working memory 4250 may include a volatile memory such as a static random access memory (SRAM), a dynamic RAM (DRAM), or a synchronous DRAM (SDRAM), and/or a nonvolatile memory such as a flash memory, a phase-change RAM (PRAM), a magneto-resistive RAM (MRAM), a resistive RAM (ReRAM), or a ferro-electric RAM (FRAM).

The embedded/card storage device 4255 may store data provided from the application processor 4100 or may provide the stored data to the application processor 4100. The embedded/card storage device 4255 may include a nonvolatile memory that stores data regardless of power supply.

For example, the embedded/card storage device 4255 may communicate with the application processor 4100 in compliance with a UFS protocol. In this example, the application processor 4100 may process communication with the embedded/card storage device 4255 through the UFS HCI 4150. In some example embodiments, when the embedded/card storage device 4255 communicates with the application processor 4100 through three or more communication lines, the embedded/card storage device 4255 and/or the application processor 4100 may include a reception circuit that adjusts a delay depending on a communication condition.

The electronic device 4000 may communicate with an external device/system through communication modules, such as a worldwide interoperability for microwave access (WIMAX) 4260, a wireless local area network (WLAN) 4262, an ultra-wideband (UWB) 4264, and/or the like. The electronic device 4000 may further include a speaker 4270 and a microphone 4275, which are used to process voice information. The electronic device 4000 may further include a global positioning system (GPS) device 4280 for processing position information. The electronic device 4000 may further include a bridge chip 4290 for managing a connection with peripheral devices.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While some example embodiments have been described, it will be apparent to those skilled in the art that various changes and modifications may be made without departing from the spirit and scope of the present disclosure. Therefore, it should be understood that the above example embodiments are not limiting, but illustrative.

What is claimed is:

1. An electronic circuit configured to receive transmission signals from three or more communication lines, the electronic circuit comprising:
    a plurality of buffers configured to output reception signals, based on transmission signal pairs which are differently selected from the transmission signals;
    a clock-data recovery circuit comprising:
        a first plurality of delay cells,
        a clock recovery circuit configured to output a recovered clock, based on a transition generated in the reception signals, and
        a data recovery circuit configured to output recovered signals, based on the recovered clock and the reception signals; and
    a control value generation circuit comprising a second plurality of delay cells, the control value generation circuit being configured to output a control value based on an output from the second plurality of delay cells, wherein:
    the recovered clock has a first edge in response to the transition generated in the reception signals, and has a second edge in response to a reset signal which is generated based on a delay of the recovered clock through the first plurality of delay cells, and
    the delay of the recovered clock through the first plurality of delay cells is adjusted based on the control value.

2. The electronic circuit of claim 1, wherein logic gates included in each delay cell of the second plurality of delay cells are connected to each other to replicate a connection between logic gates included in each delay cell of the first plurality of delay cells.

3. The electronic circuit of claim 1, wherein:
    the control value generation circuit further comprises a logic circuit configured to output a combination signal by combining the reception signals, and
    the second plurality of delay cells is configured to output a plurality of delayed combination signals, which is generated by differently delaying the combination signal.

4. The electronic circuit of claim 3, wherein:
the control value generation circuit further comprises an edge detector configured to output a detection value based on the combination signal and the plurality of delayed combination signals, and
the detection value is changed depending on a data rate of the transmission signals.

5. The electronic circuit of claim 4, wherein the detection value comprises a bit indicating an edge of the combination signal.

6. The electronic circuit of claim 5, wherein a position of the bit indicating the edge of the combination signal is associated with a length of one symbol period defined by the reception signals.

7. The electronic circuit of claim 4, wherein the control value generation circuit further comprises a divider configured to generate bits of the control value by combining a reference number of bits among bits of the detection value.

8. The electronic circuit of claim 1, wherein the control value generation circuit further comprises:
an oscillator configured to generate an oscillation clock through the second plurality of delay cells; and
a frequency controller configured to:
output an oscillation control value based on a reference clock and the oscillation clock, such that a delay of the second plurality of delay cells is adjusted, and
output the control value based on the oscillation control value, such that the delay of the recovered clock is determined.

9. The electronic circuit of claim 8, wherein a frequency of the oscillation clock is adjusted based on the oscillation control value.

10. The electronic circuit of claim 8, wherein the frequency controller comprises:
a logic circuit configured to count transitions of the oscillation clock during a reference period of the reference clock;
a comparator configured to compare a transition count counted by the logic circuit with a reference count and to output a result of the comparison; and
a value controller configured to output the oscillation control value or the control value based on the result of the comparison.

11. The electronic circuit of claim 10, wherein:
when the result of the comparison indicates that the transition count is larger than the reference count, the value controller adjusts the oscillation control value such that a frequency of the oscillation clock decreases, and
when the result of the comparison indicates that the transition count is smaller than the reference count, the value controller adjusts the oscillation control value such that the frequency of the oscillation clock increases.

12. The electronic circuit of claim 10, wherein when the result of the comparison indicates that the transition count is identical to the reference count or is within a reference range of the reference count, the value controller outputs the control value based on the oscillation control value.

13. The electronic circuit of claim 1, wherein:
the clock recovery circuit comprises a logic circuit configured to provide the first edge in response to the transition generated in the reception signals, and
the first plurality of delay cells is configured to output the reset signal by delaying an output of the logic circuit by a length of time corresponding to the control value.

14. The electronic circuit of claim 13, wherein the logic circuit is further configured to provide the second edge in response to the reset signal.

15. The electronic circuit of claim 1, wherein the data recovery circuit comprises:
the first plurality of delay cells configured to delay the reception signals by a length of time corresponding to the control value; and
a logic circuit that is configured to output the recovered signals by sampling the delayed reception signals, in response to the first edge of the recovered clock.

16. The electronic circuit of claim 1, wherein the data recovery circuit comprises a logic circuit configured to output the recovered signals by sampling the reception signals, in response to the second edge of the recovered clock.

17. An electronic circuit comprising:
a clock recovery circuit to output a recovered clock, based on a transition generated in three or more reception signals;
a data recovery circuit to output recovered signals based on the reception signals, in response to the recovered clock; and
a delay circuit to delay a signal by a variable delay depending on a data rate of the receptions signals, wherein:
the recovered clock has a first edge generated in response to the transition generated in the reception signals, and has a second edge generated in response to a reset signal which is generated based on a delay of the recovered clock, and
the delay of the recovered clock is adjusted based on the variable delay of the delay circuit.

18. The electronic circuit of claim 17, wherein each of the first edge and the second edge of the recovered clock is generated once during one symbol period defined by the reception signals.

19. The electronic circuit of claim 17, wherein a pulse width of the recovered clock corresponds to a delay between the recovered clock and the reset signal.

20. An electronic circuit comprising:
a clock-data recovery circuit to:
generate a first combination signal based on a transition generated in three or more reception signals,
output a recovered clock based on the first combination signal and a reset signal, the reset signal being generated by delaying the first combination signal through a first delay circuit, and
output recovered signals which are generated from the reception signals in response to the recovered clock; and
a control value generation circuit to output a control value based on an output from a second delay circuit, wherein:
the recovered clock has a first edge in response to the transition generated in the reception signals and has a second edge in response to the reset signal, and
a delay of the first combination signal through the first delay circuit is adjusted based on the control value.

* * * * *